United States Patent
Ohashi et al.

(10) Patent No.: US 6,636,168 B2
(45) Date of Patent: Oct. 21, 2003

(54) VARIABLE LENGTH CODING METHOD AND VARIABLE LENGTH CODING APPARATUS

(75) Inventors: Masahiro Ohashi, Kasuya-gun (JP); Tsuyoshi Nakamura, Kasuya-gun (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 10/031,711

(22) PCT Filed: May 23, 2001

(86) PCT No.: PCT/JP01/04300

§ 371 (c)(1),
(2), (4) Date: Feb. 21, 2002

(87) PCT Pub. No.: WO01/91470

PCT Pub. Date: Nov. 29, 2001

(65) Prior Publication Data

US 2003/0006917 A1 Jan. 9, 2003

(30) Foreign Application Priority Data

May 23, 2000 (JP) ........................................ 2000-151193

(51) Int. Cl.[7] ................................................ H03M 7/40
(52) U.S. Cl. ........................ 341/67; 341/94; 348/403; 348/423; 382/245; 382/246
(58) Field of Search ............................ 341/65, 67, 63, 341/60, 50, 94; 348/423, 97, 683, 701, 246, 403; 375/240.2; 382/245, 246

(56) References Cited

U.S. PATENT DOCUMENTS

| 5,835,145 A | * 11/1998 | Ouyang et al. | .......... 375/240.2 |
| 6,014,095 A | * 1/2000 | Yokoyama | ................... 341/67 |
| 6,201,487 B1 | * 3/2001 | Park et al. | ..................... 341/94 |

FOREIGN PATENT DOCUMENTS

| WO | WO98/20681 | 5/1998 |
| WO | WO98/20691 | 5/1998 |

* cited by examiner

Primary Examiner—Jean Bruner Jeanglaude
(74) Attorney, Agent, or Firm—Parkhurst & Wendel, L.L.P.

(57) ABSTRACT

A variable length coding (VLC) method and a variable length coding apparatus for producing variable length coding having a reduced number of arithmetic cycles. The method includes carrying out (a) performing a VLC process and assigning a code to a combination of (Last, Run, Level), (b) subtracting LMAX as the maximum Level corresponding to (Last, Run) from Level to calculate amended Level and thereafter assigning a code to a combination of (Last, Run, amended Level), (c) subtracting a value that is obtained by adding 1 and RMAX as the maximum Run corresponding to (Last, Level) from Run to calculate amended Run and thereafter assigning a code to a combination of (Last, amended Run, Level), and (d) of performing faxed length coding (FLC) assignment in parallel with each other, and includes (e) selecting the code according to predetermined priorities.

9 Claims, 13 Drawing Sheets

Fig.2

Priority 1   A > B > C > D
Priority 2   A > C > B > D
Priority 3   A > D

VARIABLE LENGTH CODING METHOD AND VARIABLE LENGTH CODING APPARATUS

TECHNICAL FIELD

The present invention relates to a variable length coding method and a variable length coding apparatus and, more particularly, to a variable length coding method and a variable length coding apparatus for realizing variable length coding according to MPEG4 and H.263 as standards of the picture coding system.

BACKGROUND ART

As examples of the system for coding or decoding moving picture data using band compression technology, there are an MPEG (Moving Picture Coding Experts Group) system that is standardized by the ISO, an H.263 system that is recommended by the ITU-T and the like. Basically in these systems, a screen is divided into blocks, each of which is composed of plural pixels, with utilizing correlation within the screen, then DCT (Discrete Cosine Transform) as one of the orthogonal transform system is performed on data in this block, and respective processes of quantization and VLC (variable Length Code) are carried out, thereby compressing the picture data.

In this VLC process, with respect to DCT coefficients obtained as a result of the DCT, Run which is the number of preceding coefficients of zero, Level which is a value of a non-zero coefficient and Last indicating whether the non-zero coefficient is the last one or not are taken as a combination of (Last, Run, Level), and a unique code is assigned thereto, thereby performing coding.

In MPEG4, a VLC table for the assignment of unique codes is defined, while three escape modes are applied to conform to cases where VLCs are not defined in this VLC table. In the first escape mode, with respect to the combination of (Last, Run, Level), LMAX which is the maximum Level value corresponding to Last and Run in the VLC table is subtracted from the absolute value of Level, and thereafter the VLC is performed again on the obtained result using the VLC table. In the second escape mode, with respect to the combination of (Last, Run, Level), a value which is obtained by adding 1 and RMAX as the maximum Run value corresponding Last and Level in the VLC table is subtracted from the value of Run, and thereafter the VLC is performed again on the obtained result using the VLC table. In the third escape mode, the above-mentioned combination is converted into a FLC (Fixed Length Code).

In the H.263 system and the like, the VLC table for assignment of unique codes is defined as in MPEG4, while the escape mode is only a mode of converting a combination into a FLC.

Hereinafter, a prior art process chart of the VLC in the MPEG4 will be described with reference to FIG. 12.

Initially, the description will be given of a variable length coding method by which, from the DCT coefficients rearranged in an one-dimensional array, Run as the number of preceding zero coefficients, Level as a non-zero coefficient value, and Last indicating whether the non-zero coefficient is the last one are taken as a combination of (Last, Run, Level), then a VLC process is carried out for assigning a unique code to the combination, and when the VLC assignment cannot be performed, three escape modes are applied.

FIG. 12 is a chart diagram for explaining the conventional variable length coding method.

In FIG. 12, ○ (white circle) means that data is determined, and numerals 01 to 09 denote process steps for respective coefficients. Further, Coding B corresponds to the first escape mode, Coding C corresponds to the second escape mode, and Coding D corresponds to the third escape mode.

Hereinafter, the process steps for respective coefficients are described.

In Coding A, the process 01 is a process that is activated by Last, Run and Level (i.e., the tact that there are all data at the input/output time), and when a code corresponding to the combination of (Last, Run, Level) exists in a VLC table, Code1 is outputted to the process 09, thereby completing the process. On the other hand, when the code corresponding to the combination of (Last, Run, Level) does not exist in the VLC table, a code indicating "Not exist" is outputted to Coding B.

In the Coding B, the process 02 is a process that is activated by Last and Run in the case where the corresponding code does not exist in the VLC table in the process 01, and LMAX as the maximum Level value corresponding to the combination of (Last, Run) is outputted to process 03.

The process 03 is a process that is activated by LMAX, and a process of subtracting LMAX from the Level value is carried out and a resulting NewLevel value to process 04 is outputted.

The process 04 is a process that is activated by Last, Run and Newlevel, and when a code corresponding to the combination of (Last, Run, Newlevel) exists in a VLC table, a Code2 is outputted to the process 09, thereby completing the process. On the other hand, when the code corresponding to the combination of (Last, Run, Newlevel) does not exist in the VLC table, a code indicating "Not exist" is outputted to Coding C.

In the Coding C, the process 05 is a process that is activated by Last and Level in the case where the corresponding code does not exist in the VLC table in the process 04, and RMAX as the maximum Run value corresponding to the combination of (Last, Level) is outputted to the process 06.

The process 06 is a process that is activated by RMAX, and a process of subtracting the sum of RMAX and 1 from the Run value is carried out and a resulting NewRun value is outputted to the process 07.

The process 07 is a process that is activated by Last, NewRun and Level, and when a code corresponding to the combination of (Last, NewRun, Level) exists in a VLC table, a Code 3 is outputted to the process 09, thereby completing the process. On the other hand, when the code corresponding to the combination of (Last, NewRun, Level) does not exist in the VLC table, a code indicating "Not exist" is outputted to Coding D.

In the Coding D, the process 08 is a process of converting Last, Run and Level by FLC in the case where the corresponding code does not exist in the VLC table in the process 07, and a Code4 as a FLC is outputted to the process 09.

In the process 09, an effective code is activated among the Code1-Code4 and the activated code is outputted.

FIG. 13 is a diagram summarizing processing contents of each cycle of the prior art variable length coding method.

Hereinafter, the operation of each cycle will be described. Here, the process contents in the figure are shown inside parentheses.

Initially, in the first cycle (1T), a process as normal VLC that is activated by Last, Run and Level is carried out (NORMAL VLC), and a judgement as to whether the result of the normal VLC exists in the table is made (NORMAL VLC judgement).

In the second cycle (2T), when the result of the normal VLC exists in the table in the 1T process, the result is outputted (VLC result). on the other hand, when the result of the normal VLC does not exist in the table, LMAX as the maximum Level value corresponding to Last and Run is subtracted from the Level value, thereby obtaining a NewLevel value (LMAX).

The third cycle (3T) is a process that is activated by LMAX, in which VLC corresponding to the combination of Last, Run and NewLevel is carried out (LMAX VLC). Then, a judgement as to whether the result of the VLC corresponding to the combination of Last, Run and NewLevel exists in the table is made (LMAX VLC judgement).

In the fourth cycle (4T), when the LMAX VLC result exists in the table in the 3T process, the result is outputted (VLC result). On the other hand, when the LMAX VLC result does not exist in the table, a value which is obtained by adding RMAX as the maximum Run value corresponding to Last and Level and 1 is subtracted from the Run value, thereby obtaining a NewRun value (RMAX).

The fifth cycle (5T) is a process that is activating by RMAX, in which VLC corresponding to the combination of Last, NewRun and Level is carried out (RMAX VLC). Then, a judgement as to whether the result of the VLC corresponding to the combination of Last, NewRun and Level exists in the table is made (RMAX VLC judgement).

In the sixth cycle (6T), when the RMAX VLC result exists in the table in the 5T process, the result is outputted (VLC result). On the other hand, when the RMAX VLC result does not exists in the table, Last, Run and Level are processed with a FLC, and the result is outputted (FLC result).

However, in the prior art VLC process chart according to MPEG4, assuming the process of referring to each table to be one cycle, six cycles of processing (6T) are required until the FLC result is outputted. When one FLC exists in one block, it means that there are six FLCs in one macroblock. Therefore, for one FLC, the FLC process requires 36 cycles at the maximum. To be more specific, as the number of blocks is increased, the number of cycles is increased, whereby the process speed is decreased.

The present invention is made to solve these problems, and has for its object to provide a variable length coding method and a variable length coding apparatus, which can reduces the number of arithmetic cycles and efficiently carries out VLC processes.

DISCLOSURE OF THE INVENTION

According to the present invention (aspect 1), there is provided a variable length coding method by which Run as the number of preceding zero coefficients, Level as a value of a non-zero coefficient, and Last indicating whether the non-zero coefficient is the last one are taken from discrete cosine transform coefficients which are rearranged in an one-dimensional array as a combination of (Last, Run, Level), a VLC process of assigning a unique code to the combination is carried out, and when the VLC assignment cannot be performed, three escape modes are applied, thereby performing coding, in which processes of: step (a) of performing the code assignment for the combination of (Last, Run, Level); step (b), as a first escape mode, of subtracting LMAX as a maximum Level corresponding to (Last, Run) from Level, and performing code assignment for a combination including an obtained amended Level of (Last, Run, amended Level); step (c), as a second escape mode, of subtracting a value that is obtained by adding RMAX as a maximum Run corresponding to (Last, Level) and 1 from Run, and performing code assignment for a combination including an obtained amended Run of (Last, amended Run, Level); and step (d), as a third escape mode, of assigning a FLC are carried out in parallel with each other, and step (e) of selecting the codes assigned in the steps (a) to (d) in the order of priorities: (a), (b), (c), (d), and outputting the selected codes is carried out.

According to the present invention (aspect 2), in the variable length coding method of aspect 1, according to a method for assigning the variable length code, the order of priorities by which coded data is selected in the step (e) is decided by selecting one of three patterns: (a), (b), (c), (d); (a), (c), (b), (d); and (a), (d).

According to the variable length coding method that is constructed as described above, the priorities can be arbitrarily set, and further a unique code is always assigned by the FLC in step (d). Therefore, when the order of priorities are determined as step (a), step (d) (steps (b) and (c) are not in order), it can be forcefully decided not to select steps (b) and (c), whereby this method can conform to H.263 that is an image compression method by which the variable length coding is performed in step (a) and (d).

According to the present invention (aspect 3), there is provided a variable length coding apparatus comprising an RMAX table for receiving a Level absolute value signal as an absolute value of a Level signal and a Last signal; an LMAX table for receiving a Run signal and the Last signal; a first VLC table for receiving the Level absolute value signal, a signal indicating the sign of the Level signal, the Run signal, and the Last signal; a first subtraction circuit for subtracting a sum of an output signal of the RMAX table and 1, from the Run signal; a second register for holding an output signal of the first subtraction circuit; a second VLC table for receiving an output signal of the second register, the Level absolute value signal, the signal indicating the sign of the Level signal, and the Last signal; a second subtraction circuit for subtracting an output signal of the LMAX table from the Level absolute value signal; a third register for holding an output signal of the second subtraction circuit; a third VLC table for receiving an output signal of the third register, the signal indicating the sign of the Level signal, the Run signal, and the Last signal; a first register for holding an output signal of the first VLC table; a fourth register for holding an output signal of the second VLC table; a fifth register for holding an output signal of the third VLC table; an RMAX VLC generation circuit for receiving an output signal of the fourth register; an LMAX VLC generation circuit for receiving an output signal of the fifth register; a FLC generation circuit for receiving the Level signal, the Run signal, and the Last signal; a control circuit for receiving an output signal of the first register, the output signal of the fourth register, and the output signal of the fifth register; and a selection circuit for receiving the output signal of the first register, an output signal of the RMAX VLC generation circuit, an output signal of the LMAX VLC generation circuit, and an output signal of the FLC generation circuit, in which the control circuit judges whether the output signal of the first register, the output signal of the fourth register, and the output signal of the fifth register are correct as VLC, and outputs a selection signal for indicating the judgement result to the selection circuit, and the selection circuit selects one output signal from the output signal of the first register, the output signal of the PMAX VLC generation circuit, the output signal of the LMAX VLC generation circuit, and the output signal of the FLC generation circuit, in accordance with the selection signal, and outputs the selected signal as a code.

According to the variable length coding apparatus that is constituted as described above, all processes can be implemented in two cycles, whereby the number of the process cycles can be reduced.

According to the present invention (aspect 4), in the variable length coding apparatus of aspect 3, the control circuit judges whether the output signal of the first register, the output signal of the fourth register, and the output signal of the fifth register are correct as VLC, and outputs the judgement result to the selection circuit according to preset priorities.

According to the variable length coding apparatus that is constituted as described above, all processes can be implemented in two cycles, whereby the number of the process cycles can be reduced.

According to the present invention (aspect 5), there is provided a variable length coding apparatus comprising an PMAX table for receiving a Level absolute value signal as an absolute value of a Level signal and a Last signal; an LMAX table for receiving a Run signal and the Last signal; a first subtraction circuit for subtracting a sum of an output signal of the RMAX table and 1, from the Run signal; a second subtraction circuit for subtracting an output signal of the LMAX table from the Level absolute value signal; a second register for holding an output signal of the first subtraction circuit; a third register for holding an output signal of the second subtraction circuit; a first selection circuit for selecting one of an output signal of the third register and the Level absolute value signal; a second selection circuit for selecting one of an output signal of the second register and the Run signal; a VLC table for receiving an output signal of the first selection circuit, an output signal of the second selection circuit, a signal indicating the sign of the Level signal, and the Last signal; a first register for holding an output signal of the VLC table, a FLC generation circuit for receiving the Level signal, the Run signal, and the Last signal; a control circuit for receiving an output signal of the first register; a VLC generation circuit for receiving the output signal of the first register, and an output signal of the control circuit; and a third selection circuit for receiving an output signal of the VLC generation circuit and an output signal of the FLC generation circuit, in which in a first cycle, the first selection circuit receives a first selection signal outputted from the control circuit, selects the Level absolute value signal, and outputs the Level absolute value signal to the VLC table, the second selection circuit receives a second selection signal outputted from the control circuit, selects the Run signal, and outputs the Run signal to the VLC table, then the VLC table implements VLC, outputs an output signal to the first register, and in a second cycle, the control circuit judges whether the output signal of the first register is correct as normal VLC, and when the output signal of the first register is judged to be correct as normal VLC, outputs a third selection signal indicating the judgement result to the VLC generation circuit and the third selection circuit, the VLC generation circuit outputs the output signal of the first register as a normal VLC code, and the third selection circuit selects the output signal of the VLC generation circuit in accordance with the third selection signal and outputs the selected signal, in the first cycle, the LMAX table receives the Last signal and the Run signal, generates an LMAX data signal, and outputs the LMAX data signal to the second subtraction circuit, the second subtraction circuit receives the LMAX data signal and the Level absolute value signal, subtracts the LMAX data signal from the Level absolute value signal, and outputs an obtained result to the third register, and in the second cycle, the first selection circuit receives the first selection signal outputted from the control circuit, selects the output signal of the third register, and outputs the selected signal to the VLC table, the second selection circuit receives the second selection signal outputted from the control circuit, selects the Run signal, and outputs the selected Run signal to the VLC table, then the VLC table implements VLC, outputs an output signal to the first register, and in the third cycle, when the judgement of the normal VLC performed in the second cycle shows that the output signal is not correct, the control circuit judges whether the output signal of the first register is correct as LMAX VLC, and when the output signal of the first register is judged to be correct as LMAX VLC, outputs the third selection signal indicating the judgement result to the VLC generation circuit and the third selection circuit, the VLC generation circuit outputs the output signal of the first register as an LMAX VLC code, and the third selection circuit selects the output signal of the VLC generation circuit in accordance with the third selection signal and outputs the selected signal, and in the first cycle, the RMAX table receives the Last signal and the Level absolute value signal, generates an RMAX data signal, and outputs the RMAX data signal to the first subtraction circuit, the first subtraction circuit receives the RMAX data signal and the Run signal, subtracts a value that is obtained by adding the RMAX data signal and 1, from the Run signal, and outputs an obtained result to the second register, and in the third cycle, the first selection circuit receives the first selection signal outputted from the control circuit, selects the Level absolute value signal, and outputs the selected signal to the VLC table, the second selection circuit receives the second selection signal outputted from the control circuit, selects the output signal of the second register, and outputs the selected signal to the VLC table, then the VLC table implements VLC, outputs an output signal to the first register, and in a fourth cycle, when the judgement of the LMAX VLC performed in the third cycle shows that the output signal is not correct, the control circuit judges whether the output signal of the first register is correct as RMAX VLC, and when the output signal of the first register is judged to be correct as RMAX VLC, outputs the third selection signal to the VLC generation circuit and the third selection circuit, the VLC generation circuit outputs the output signal of the first register as an RMAX VLC code, and the third selection circuit selects the output signal of the VLC generation circuit in accordance with the third selection signal and outputs the selected signal, and when it is judged that none of the output signals of the first register, inputted to the control circuit, is correct as VLC, in a fifth cycle, the third selection circuit selects the output signal of the FLC generation circuit and outputs the selected signal.

According to the variable length coding apparatus that is constituted as described above, the priorities can be arbitrarily set. Further, when the priorities are set so as to select the output signal of the first register and then the output signal of the FLC generation circuit (remaining two signals are not in order), this apparatus can conform to the image compression method according to H.263.

According to the variable length coding apparatus that is constituted as described above, the NewLevel signal and the NewRun signal can be calculated while simultaneously performing the normal VLC. Further, although the prior art VLC process requires six cycles, this apparatus can reduce the number of process cycles to five cycles. Furthermore, the process is conventionally carried out using three VLC tables, while this apparatus can perform the VLC with one VLC table, thereby reducing the circuit area.

According to the present invention (aspect 6), there is provided a variable length coding apparatus comprising an PMAX table for receiving a Level absolute value signal as an absolute value of a Level signal and a Last signal; an LMAX table for receiving a Run signal and the Last signal; a first subtraction circuit for subtracting a sum of an output signal of the PMAX table and 1, from the Run signal; a second subtraction circuit for subtracting an output signal of the LMAX table from the Level absolute value signal; a second register for holding an output signal of the first subtraction circuit; a third register for holding an output signal of the second subtraction circuit; a first selection circuit for selecting one of an output signal of the third register and the Level absolute value signal; a second selection circuit for selecting one of an output signal of the second register and the Run signal; a VLC table for receiving an output signal of the first selection circuit, and output signal of the second selection circuit, a signal indicating the sign of the Level signal, and the Last signal; a first register for holding an output signal of the VLC table; a FLC generation circuit for receiving the Level signal, the Run signal, and the Last signal; a control circuit for receiving an output signal of the first register; a VLC generation circuit for receiving the output signal of the first register and an output signal of the control circuit; and a third selection circuit for receiving an output signal of the VLC generation circuit and an output signal of the FLC generation circuit, in which in a first cycle, the first selection circuit receives a first selection signal outputted from the control circuit, selects the Level absolute value signal, and outputs the selected signal to the VLC table, the second selection circuit receives a second selection signal outputted from the control circuit, selects the Run signal, and outputs the Run signal to the VLC table, then the VLC table implements VLC and outputs an output signal to the first register, and in a second cycle, the control circuit judges whether the output signal of the first register is correct as normal VLC, and when the output signal of the first register is judged to be correct as normal VLC, outputs a third selection signal indicating the judgement result to the VLC generation circuit and the third selection circuit, the VLC generation circuit outputs the output signal of the first register as a normal VLC code, and the third selection circuit selects the output signal of the VLC generation signal in accordance with the third selection signal and outputs the selected signal, and in the first cycle, the LMAX table receives the Last signal and the Run signal, generates an LMAX data signal, and outputs the generated signal to the second subtraction circuit, the second subtraction circuit receives the LMAX data signal and the Level absolute value signal, subtracts the LMAX data signal from the Level absolute value signal, and outputs an obtained result to the third register, and in the second cycle, the first selection circuit receives the first selection signal outputted from the control circuit, selects the output signal of the third register, and outputs the selected signal to the VLC table, the second selection circuit receives the second selection signal outputted from the control circuit, selects the Run signal, and outputs the Run signal to the VLC table, then the VLC table implements VLC and outputs an output signal to the first register, and in the third cycle, when the judgement of the normal VLC performed in the second cycle shows that the output signal is not correct, the control circuit judges whether the output signal of the first register is correct as LMAX VLC, and when the output signal of the first register is judged to be correct as LMAX VLC, outputs the third selection signal indicating the judgement result to the VLC generation circuit and the third selection circuit, the VLC generation circuit outputs the output signal of the first register as an LMAX VLC code, and the third selection circuit selects the output signal of the VLC generation circuit in accordance with the third selection signal and outputs the selected signal, and in the first cycle, the RMAX table receives the Last signal and the Level absolute value signal, generates an PMAX data signal, and outputs the generated signal to the first subtraction circuit, the first subtraction circuit receives the RMAX data signal and the Run signal, subtracts a value that is obtained by adding the PMAX data signal and 1, from the Run signal, and outputs an obtained result to the second register, and in the third cycle, the first selection circuit receives the first selection signal outputted from the control circuit, selects the Level absolute value signal, and outputs the selected signal to the VLC table, the second selection circuit receives the second selection signal outputted from the control circuit, selects an output signal of the second register, and outputs the selected signal to the VLC table, then the VLC table implements VLC and outputs an output signal to the first register, and in a fourth cycle, when the judgement of the LMAX VLC performed in the third cycle shows that the output signal is not correct, the control circuit judges whether the output signal of the first register is correct as RMAX VLC, and when the output signal of the first register is judged to be correct as RMAX VLC, outputs the third selection signal to the VLC generation circuit and the third selection circuit, the VLC generation circuit outputs the output signal of the first register as an RMAX VLC code, and the third selection circuit selects an output signal of the VLC generation circuit in accordance with the third selection signal and outputs the selected signal, and when it is judged that none of the output signals of the first register, inputted to the control circuit, is correct as VLC, in the fourth cycle, the third selection circuit selects the output signal of the FLC generation circuit and outputs the selected signal.

According to the variable length coding apparatus that is constituted as described above, the NewLevel signal and the NewRun signal can be calculated while simultaneously performing the normal VLC. In addition, although the prior art VLC process requires six cycles, this apparatus can reduce the number of process cycles to four cycles. Further, the process is conventionally carried out using three VLC tables, while this apparatus can perform the VLC with one VLC table, thereby reducing the circuit area.

According to the present invention (aspect 7), in the variable length coding apparatus of aspects 5 or 6, the control circuit judges whether the output signal of the first register is correct or not as VLC, further decides the number of cycles in which the output signal is incorrect, thereby performing control of the VLC, and changes an output order of the VLC according to predetermined priorities.

According to the variable length coding apparatus that is constituted as described above, the priorities can be arbitrarily set. Further, a unique code is always assigned in the FLC generation circuit. Therefore, when the priorities are set such that the output signal of the FLC generation circuit is selected when the normal VLC is judged and the result of the judgement is incorrect, this apparatus can conform to the image compression method according to H.263.

According to the present invention (aspect 8), there is provided a variable length coding apparatus comprising a first selection circuit for receiving a Level absolute value signal as an absolute value of a Level signal, a Last signal, and fixed values, selecting one of the Level absolute value signal and the fixed value to output a first output signal, and selecting one of the Last signal and the fixed value to output a second output signal; an RMAX table for receiving the first output signal and the second output signal; a second selection circuit for receiving a Run signal, the Last signal and fixed values, selecting one of the Run signal and the fixed value to output a third output signal, and selecting one of the Last signal and the fixed value to output a fourth selection signal; an LMAX table for receiving the third output signal and the fourth output signal; a first subtraction circuit for subtracting a sum of an output signal of the RMAX table and 1, from the Run signal; a second subtraction circuit for subtracting an output signal of the LMAX table from the Level absolute value signal; a second register for holding an output signal of the first subtraction circuit; a third register for holding an output signal of the second subtraction circuit; a third selection circuit for selecting one of an output signal of the third register and the Level absolute value signal; a fourth selection circuit for selecting one of an output signal of the second register and the Run signal; a VLC table for receiving an output signal of the third selection circuit, an output signal of the fourth selection circuit, a signal indicating the sign of the Level signal, and the Last signal; a first register for holding an output signal of the VLC table; a FLC generation circuit for receiving the Level signal, the Run signal, and the Last signal; a control circuit for receiving an output signal of the first register; a VLC generation circuit for receiving the output signal of the first register and an output signal of the control circuit; and a fifth selection circuit for receiving an output signal of the VLC generation circuit and an output signal of the FLC generation circuit, in which in a first cycle, the first selection circuit receives a first selection signal outputted from the control circuit and selects the fixed value, the second selection circuit receives a second selection signal outputted from the control circuit and selects the Run signal and the Last signal, the third selection circuit receives a third selection signal outputted from the control circuit, selects the Level absolute value signal, and outputs the selected signal to the VLC table, the fourth selection circuit receives a fourth selection signal outputted from the control circuit, selects the Run signal, and outputs the Run signal to the VLC table, and then the VLC table implements VLC and outputs an output signal to the first register, and in a second cycle, the control circuit judges whether the output signal of the first register is correct as normal VLC, and when the output signal of the first register is judged to be correct as normal VLC, outputs a fifth selection signal indicating the judgement result to the VLC generation circuit and the fifth selection circuit, the VLC generation circuit outputs the output signal of the first register as a normal VLC code, and the fifth selection circuit selects the output signal of the VLC generation circuit in accordance with the fifth selection signal and outputs the selected signal, and in the first cycle, the LMAX table receives the Last signal and the Run signal, generates an LMAX data signal, and outputs the generated signal to the second subtraction circuit, the second subtraction circuit receives the LMAX data signal and the Level absolute value signal, subtracts the LMAX data signal from the Level absolute value signal, and outputs an obtained result to the third register, and in the second cycle, the third selection circuit receives the third selection signal outputted from the control circuit, selects the output signal of the third register, and outputs the selected signal to the VLC table, the fourth selection circuit receives the fourth selection signal outputted from the control circuit, selects the Run signal, and outputs the Run signal to the VLC table, then the VLC table implements VLC and outputs an output signal to the first register, and in a third cycle, when the judgement of the normal VLC performed in the second cycle shows that the output signal is not correct, the control circuit judges whether the output signal of the first register is correct as LMAX VLC, and when the output signal of the first register is judged to be correct as LMAX VLC, outputs the fifth selection signal indicating the judgement result to the VLC generation circuit and the fifth selection circuit, the VLC generation circuit outputs the output signal of the first register as an LMAX VLC code, and the fifth selection circuit selects an output signal of the VLC generation circuit in accordance with the fifth selection signal and outputs the selected signal, and in the second cycle, the RMAX table receives the Last signal and the Level absolute value signal, generates an RMAX data signal, and outputs the generated signal to the first subtraction circuit, and the first subtraction circuit receives the RMAX data signal and the Run signal, subtracts a value that is obtained by adding the RMAX data signal and 1, from the Run signal, and outputs an obtained result to the second register, and in the third cycle, the third selection circuit receives the third selection signal outputted from the control circuit, selects the Level absolute value signal, and outputs the selected signal to the VLC table, the fourth selection circuit receives the fourth selection signal outputted from the control circuit, selects the output signal of the second register, and outputs the selected signal to the VLC table, then the VLC table implements VLC and outputs an output signal to the first register, and in a fourth cycle, when the judgement of LMAX VLC performed in the third cycle shows that the output signal is not correct, the control circuit judges whether the output signal of the first register is correct as RMAX VLC, and when the output signal of the first register is judged to be correct as RMAX VLC, outputs the fifth selection signal indicating the judgement result to the VLC generation circuit and the third selection circuit, the VLC generation circuit outputs the output signal of the first register as an RMAX VLC code, and the fifth selection circuit selects an output signal of the VLC generation circuit in accordance with the fifth selection signal and outputs the selected signal, and when it is judged that none of the output signals of the first register, inputted to the control circuit, is correct as VLC, in the fourth cycle, the fifth selection circuit selects the output signal of the FLC generation circuit and outputs the selected signal.

According to the variable length coding apparatus that is constituted as described above, the RMAX table is never accessed in the first cycle, whereby the consumed power can be reduced. Further, while the prior art VLC process requires six cycles, the number of process cycles can be reduced to four cycles. Furthermore, the processes are conventionally performed using three VLC tables, while the VLC process can be carried out with one VLC table, whereby the circuit area can be reduced.

According to the present invention (aspect 9), in the variable length coding apparatus of aspect 8, the control circuit judges whether the output signal of the first register is correct or not as VLC and further decides the number of cycles in which the output signal is incorrect, thereby performing control of the VLC, and changes an output order of the VLC according to predetermined priorities.

According to the variable length coding apparatus that is constituted as described above, the priorities can be arbitrarily set. Further, a unique code is always assigned in the FLC generation circuit. Therefore, when the priorities are set such that the output signal of the FLC generation circuit is selected when the normal VLC is judged and the result of the judgement is incorrect, this apparatus can conform to the image compression method according to H.263.

BRIEF DESCRIPTION OF THE DRAWINGS

FIG. 2 is a diagram for explaining combinations of priorities of outputting codes according to the first embodiment.

BEST MODE FOR CARRYING OUT THE INVENTION

Hereinafter, embodiments of the present invention will be described.

Embodiment 1

According to a variable length coding method according to a first embodiment, among DCT coefficients rearranged in an one-dimensional array, taking Run as the number of preceding zero coefficients, Level as a value of a non-zero coefficient and Last indicating whether the non-zero coefficient is the last one as a combination of (Last, Run, Level), a Variable Length Code (hereinafter, abbreviated as VLC) assignment of assigning a unique code to this combination is performed, and when the VLC assignment cannot be performed, three escape modes (which will be described later) are applied thereto.

Figure 1:
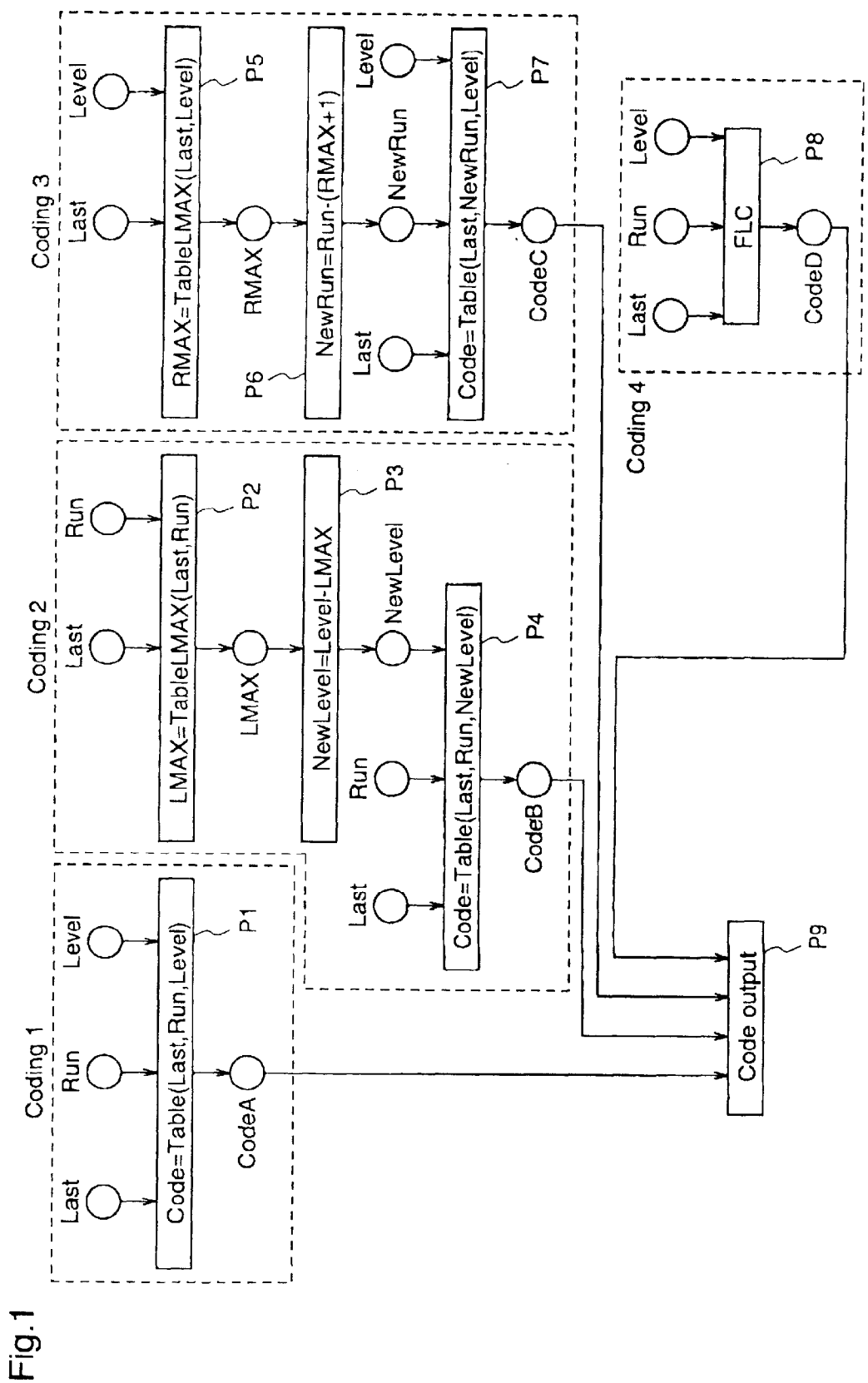
FIG. 1 is a chart diagram for explaining a variable length coding method according to a first embodiment of the present invention.

FIG. 1 is a chart diagram for explaining a variable length coding method according to the first embodiment.

In FIG. 1, ○ (white circle) represents that data is determined and P1–P9 denote process steps for respective coefficients. Further, Coding 2 corresponds to the first escape mode, Coding 3 corresponds to the second escape mode, and Coding 4 corresponds to the third escape mode.

Hereinafter, the process steps for respective coefficients will be described.

In Coding 1, the process P1 is a process that is activated by Last, Run and Level (i.e., the fact that there are all data at the input/output time), in which when a code corresponding to the combination of (Last, Run, Level) exists in a VLC table, a Code A of normal VLC is outputted to the process P9. On the other hand, when the VLC corresponding to the combination of (Last, Run, Level) does not exist, a code indicating "Not exist" is outputted to the process P9.

In the Coding 2, the process P2 is a process that is activated by Last and Run, in which LMAX as the maximum Level value corresponding to the combination of (Last, Run) is outputted to the process P3. The process P3 is a process activated by LMAX, in which a process of subtracting LMAX from the Level value is carried out and a resulting NewLevel value is outputted to the process P4. The process P4 is a process that is activated by Last, Run and NewLevel, in which when a code corresponding to the combination of (Last, Run, NewLevel) exists in a VLC table, a Code B is outputted to the process P9. To be more specific, the code B is "0000011" (code of the ESC (escape code), "0" (indicating VLC of LMAX) and the VLC result, which are outputted as coded LMAX data to the process P9. On the other hand, when the VLC corresponding to the combination of (Last, Run, NewLevel) does not exist, a code indicating "Not exist" is outputted to the process P9.

In Coding 3, the process P5 is a process that is activated by Last and Level, in which an RMAX value as the maximum Run corresponding to the combination of (Last, Level) is outputted to the process P6. The process P6 is a process activated by RMAX, in which a process of subtracting the sum of RMAX and 1 from the Run value is carried out, and a resulting NewRun value is outputted to the process P7. The process P7 is a process that is activated by Last, NewRun and Level, in which when a code corresponding to the combination of (Last, NewRun, Level) exists in the VLC table, a code C is outputted to the process P9. To be more specific, the Code C is "0000011" (ESC code), "10" (indicating VLC of RMAX) and the VLC result, which are outputted to the process P9 as coded RMAX data. On the other hand, when the VLC corresponding to the combination of (Last, NewRun, Level) does not exist, a code indicating "Not exist" is outputted to the process P9.

In Coding 4, the process P8 is a process of converting data into a FLC (Fixed Length Code), in which in the case of H.263, "0000011" (ESC code) and the FLC result, i.e., (Last-1 bits, Run-6 bits, Level-8 bits) are outputted to the process P9 as FLC coded data. In the case of MPEG4, "0000011" (ESC code), "11" (indicating a FLC according to MPEG4) and a FLC result, i.e., (Last-1 bits, Run-6 bits, 1, Leve-12 bits, 1) are outputted to the process P9 as FLC coded data In the process P9, data of Code A–Code D are selected according to predetermined priorities, and then the selected data are outputted. Combinations of the priorities are shown in FIG. 2.

In FIG. 2, A–D denote Code A–Code D, respectively. For example it is assumed that priority 1 is set as the combination of priorities in the process P9. To be more specific, when the data of Code A exists in the process P9, the data of Code A is outputted in the process P9 even when any data of Code B, Code C and Code D exist. On the other hand, when the data of Code A does not exist but data of Code B exists in the process P9, the data of Code B is outputted in the process P9 even when any data of Code C and Code D exists. Further, when the data of Code A and Code B do not exist but data of Code C exists in the process P9, the data of Code C is outputted in the process P9 even when data of Code D exists. When any data of Code A, Code B and Code C does not exist in the process P9, the data of Code D is outputted in the process P9.

As described above, according to the variable length coding method of the first embodiment, the respective processes of Coding 1 (P1), Coding 2 (P2, P3, P4), Coding 3 (P5, P6, P7), and Coding 4 (P8) are carried out simultaneously, and data are outputted according to the predetermined priority. Therefore, all processes can be carried out in two steps (processing and judgement of each coding), whereby the number of process steps can be reduced. Further, assuming that the number of process steps of P2, P3 and P4 is two steps and the number of process steps of P5, P6 and P7 is two steps, all of the processes can be carried out in three steps.

In this variable length coding method according to the first embodiment, while the combination of the priorities in the process P9 is assumed to be Code A>Code B>Code C>Code D, the priorities are not limited to this combination. Even the priorities are assumed to be Code A>Code C>code B>code D, the same effects can be obtained. Further, since a unique code is always assigned to the Code D by the FLC, when the priorities are decided as Code A>Code D (the remaining two codes are not in order), it can be forcefully decided not to select the Code B and the Code C, whereby it can be applied to H.263 as a picture compression method by which the variable length coding is performed by the Coding 1 and the Coding 4.

Embodiment 2

A variable length coding apparatus according to the second embodiment is an apparatus for realizing the above-mentioned variable length coding method of the first embodiment.

Figure 3:
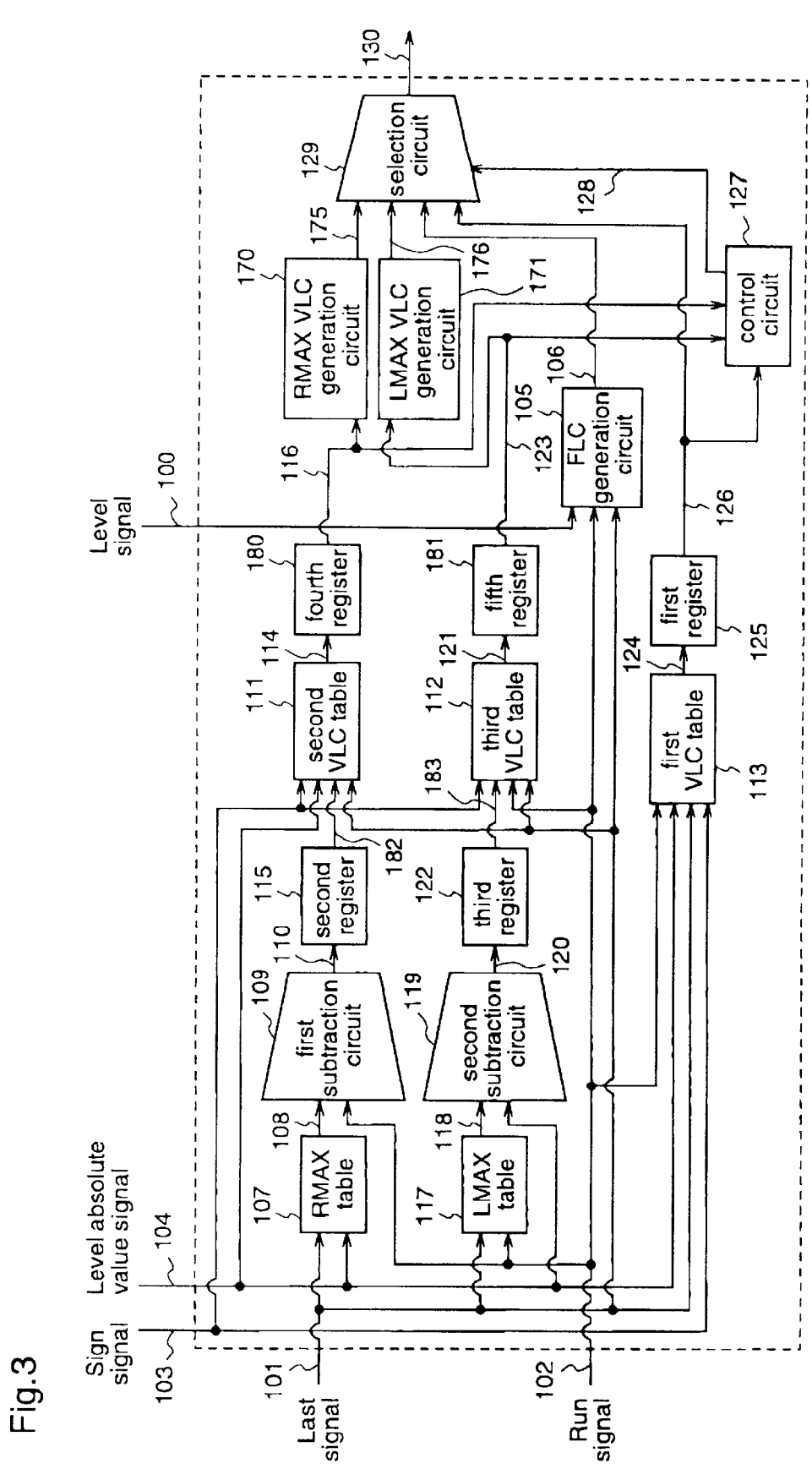
FIG. 3 is a block diagram for explaining a structure of a variable length coding apparatus according to a second embodiment of the present invention.

FIG. 3 is a block diagram for explaining a structure of the variable length coding apparatus according to the second embodiment.

In FIG. 3, numeral 100 denotes a Level signal, numeral 101 denotes a Last signal, numeral 102 denotes a Run signal, numeral 103 denotes a Sign signal indicating the sign of the Level signal 100, and numeral 104 denotes a Level absolute value signal as the absolute value of the Level signal 100. Numeral 105 denotes a FLC generation circuit. Numeral 106 denotes a FLC data signal as an output signal of the FLC generation circuit 105. Numeral 107 denotes an RMAX table. Numeral 108 denotes an RMAX data signal as an output signal of the RMAX table 107. Numeral 109 denotes a first subtraction circuit. Numeral 110 denotes an output signal of the first subtraction circuit 109. Numeral 115 denotes a second register for holding the output signal 110 of the first subtraction circuit 109. Numeral 182 denotes a NewRun signal outputted from the second register 115. Numeral 111 denotes a second VLC table. Numeral 114 denotes a second VLC data signal as an output signal of the second VLC table 111. Numeral 180 denotes a fourth register for holding the second VLC data signal 114. Numeral 116 denotes a VLC data signal generated using the NewRun signal 182. Numeral 117 denotes an LMAX table. Numeral 118 denotes an LMAX data signal as an output signal of the LMAX table 117. Numeral 119 denotes a second subtraction circuit. Numeral 120 denotes an output signal of the second subtraction circuit 119. Numeral 122 denotes a third register for holding an output signal of the second subtraction circuit 119. Numeral 183 denotes a NewLevel signal outputted by the third register 122. Numeral 112 denotes a third VLC table. Numeral 121 denotes a third VLC data signal as an output signal of the third VLC table 112. Numeral 181 denotes a fifth register for holding the third VLC data signal 121. Numeral 123 denotes a VLC data signal generated using the NewLevel signal 183. Numeral 113 denotes the first VLC table. Numeral 124 denotes a first VLC data signal as an output signal of the first VLC table 113. Numeral 125 denotes a first register for holding the first VLC data signal 124. Numeral 126 denotes a normal VLC data signal. Numeral 170 denotes an RMAX VLC generation circuit for receiving the VLC data signal 116 generated using the NewRun signal and generating coded data of RMAX. Numeral 175 denotes an RMAX data signal as an output signal of the VLC generation circuit 170. Numeral 171 denotes an LMAX VLC generation circuit for receiving the VLC data signal 123 generated using the NewLevel signal and generating coded data of LMAX. Numeral 176 denotes an LMAX data signal as an output signal of the LMAX VLC generation circuit 171. Numeral 127 denotes a control circuit for receiving the normal VLC data signal 126, the VLC data signal 116 generated using the NewRun signal and the VLC data signal 123 generated using the NewLevel signal, and selecting a VLC data signal according to the preset priorities. Numeral 128 denotes a selection signal for outputting the data signal selected by the control circuit 127. Numeral 129 denotes a selection circuit for receiving the RMAX data signal 175, the LMAX data signal 176, the FLC data signal 106 and the normal VLC data signal 126, and selecting a data signal to be outputted in accordance with the selection signal 128. Numeral 130 denotes the data signal selected by the selection circuit 129.

Next, the operation of the variable length coding apparatus according to the second embodiment will be described with making the above-mentioned block diagram of FIG. 3 correspond to the chart diagram of FIG. 1.

Initially, in the process of Coding 1, the first VLC table 113 receives the Last signal 101, the Run signal 102, the Level absolute value 104 and the Sign signal 103, thereby generating the first VLC data signal 124 (P1), and stores the generated signal 124 in the first register 125. Then, the first register 125 outputs the normal VLC data signal 126 to the control circuit 127 and the selection circuit 129 (P9).

In the process of Coding 3, the RMAX table 107 receives the Last signal 101 and the Level absolute value signal 104, thereby generating the RMAX data signal 108 (P5), and outputs the generated signal 108 to the first subtraction circuit 109. The first subtraction circuit 109 receives the RMAX data signal 108 and the Run signal 102, subtracts the sum of the RMAX data signal 108 and 1 from the Run signal 102 value (P6), and outputs the obtained result to the second register 115 as the output signal 110 of the first subtraction circuit. The second register 115 holds the output signal 110 inputted by the first subtraction circuit. Subsequently, the second VLC table 111 receives the NewRun signal 182 outputted from the second register 115, the Last signal 101, the Level absolute value signal 104 and the Sign signal 103, thereby generating the do second VLC data signal 114 (P7), and outputs the generated signal 114 to the fourth register 180. The fourth register 180 holds the inputted second VLC data signal 114. Then, the fourth register 180 outputs the VLC data signal 116, which is generated using the NewRun signal, Lo the control circuit 127.

Further, in the process of coding 2, the LMAX table 117 receives the Last signal 101 and the Run signal 102, thereby generating the LMAX data signal 118 (P2), and outputs the generated signal 118 to the second subtraction circuit 119. The second subtraction circuit 119 receives the LMAX data signal 118 and the Level absolute value signal 104, thereby subtracting the LMAX data signal 118 from the Level absolute value signal 104 (P3), and outputs the obtained result to the third register 122 as the output signal 120 of the second subtraction circuit. The third register 122 holds the output signal 120 inputted from the second subtraction circuit. Subsequently, the third VLC table 112 receives the NewLevel signal 183 outputted from the third register 122, the Last signal 101, the Run signal 102 and the Sign signal 103, thereby generating the third VLC data signal 121 (P4), and outputs the generated signal 121 to the fifth register 181. The fifth register 181 holds the inputted third VLC data signal 121. Then, the fifth register 181 outputs the VLC data signal 123, which is generated using the NewLevel signal, to the control circuit 127.

The RMAX VLC generation circuit 170 performs VLC assignment to the VLC data signal 116 generated using the NewRun signal, which is outputted from the fourth register 180, and outputs (ESC code+"0"+VLC result) as the RMAX data signal 175 that is coded RMAX data, to the selection circuit 129 (P9). Further, the LMAX VLC generation circuit 171 performs VLC assignment to the VLC data signal 123 generated using the NewLevel signal, which is outputted from the fifth register 181, and outputs (ESC code+"10"+ VLC result) as the LMAX data signal 176 that is coded LMAX data, to the selection circuit 129 (P6). Subsequently, the control circuit 127 receives the normal VLC data signal 126 outputted from the first register 125, the VLC data signal 116 generated using the NewRun signal, which is outputted from the fourth register 180, and the VLC data signal 123 generated using the NewLevel signal, which is outputted from the fifth register 181, and makes a judgement as to whether each of the VLC data signals is correct as VLC. Then, the control circuit 127 outputs the selection signal 128 for selecting the VLC data signal according to preset priorities.

For example, it is assumed that the priorities are set to select data in the order of: normal VLC data, VLC data generated using the NewLevel signal, VLC data generated using the NewRun signal, the FLC data (Priority 1 in FIG. 2). To be more specific, when the normal VLC data 126 exists in the control circuit 127, the control circuit 127 outputs the selection signal 128 for selecting the normal VLC data signal 126 to the selection circuit 129, regardless of existence of the VLC data signal 123 generated using the NewLevel signal or the VLC data signal 116 generated using the NewRun signal. On the other hand, when the normal VLC data signal 126 does not exist but the VLC data signal 123 generated using the NewLevel signal exists in the control circuit 127, the control circuit 127 outputs the selection signal 128 for selecting the VLC data signal 123 generated using the NewLevel signal to the selection circuit 129, regardless of existence of the VLC data signal 116 generated using the NewRun signal. Further, when the normal VLC data signal 129 and the VLC data signal 123 generated using the NewLevel signal do not exist but the VLC data signal 116 generated using the NewRun signal exists in the control circuit 127, the control circuit 127 outputs the selection signal 128 for selecting the VLC data signal 116 generated using the NewRun signal to the selection circuit 129. Then, the selection circuit 129 selects one of the VLC data signals under the control of the selection signal 128 inputted from the control circuit 127, and outputs the selected VLC data signal as the data signal 130. On the other hand, when the selection signal 128 for selecting the VLC data signal is not inputted from the control circuit 127, the selection circuit 129 selects the FLC data signal 106 and outputs the signal as the data signal 130.

Figure 4:
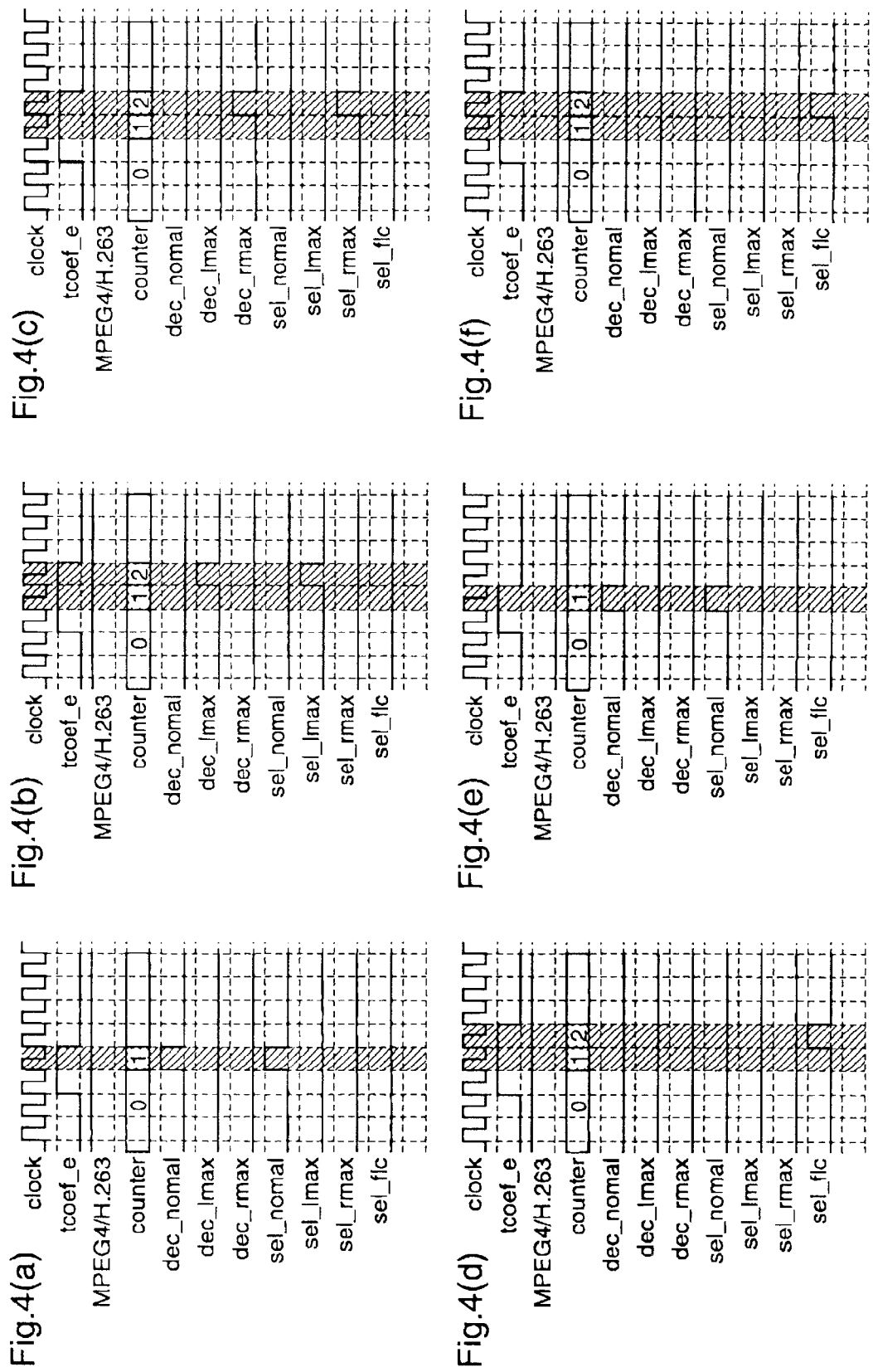
FIG. 4 are timing charts for explaining operations of a control circuit according to the second embodiment of the present invention.

FIG. 4 are timing charts for explaining the operation of the control circuit according to the second embodiment.

In FIG. 4, "clock" is a signal of a prescribed cycle, and "tcoef_e" is a start signal indicating that there are all data enabling to start VLC. "MPEG4/H.263" is a signal indicating one of the standards, and this signal indicates MPEG4 when it is H (High) while indicating H.263 when it is L (Low). "Counter" denotes the start of a judgement and the number of times of the judgement. "Dec_nomal" is the normal VLC data signal 126, which indicates the result of the first VLC table 113. "Dec_lmax" is a VLC data signal 123 generated using the NewLevel signal, which indicates the result of the third VLC table 112. "Dec_rmax" is the VLC data signal 116 generated using the NewRun signal, which indicates the result of the second VLC table 111. "Sel_nomal" is changed to H when the result of the normal VLC data signal 126 (dec_nomal) exists in the VLC table. "Sel_lmax" is changed to H when the result of the VLC data signal 123 (dec_lmax) that is generated using the NewLevel signal exists in the VLC table. "Sel_rmax" is changed to H when the result of the VLC data signal 116 (dec_rmax) that is generated using the NewRun signal exists in the VLC table. "Sel_flc" is changed to H when any result of the normal VLC data signal 126, the VLC data signal 123 generated using the NewLevel signal, and the VLC data signal 116 generated using the NewRun signal does not exist in the VLC table. A diagonally shaded part denotes the number of cycles in which the judgement is made.

Next, each of the VLC data signals will be described.

FIG. 4(a) is a timing chart in a case of selecting the normal VLC data signal according to MPEG4.

In FIG. 4(a), when the counter indicates a value of 0 and there comes in all data enabling to start the judgement of the VLC table, a judgement as to rising of the tcoef_e start signal is made As a result of the judgement, when the signal dec_nomal is H (i.e., it indicates that there are data) when the counter value is 1, the signal sel_nomal is changed to H regardless of the result of the signals dec_lmax and dec_rmax. At this time, the control circuit 127 outputs the selection signal 128 for selecting the normal VLC data signal 126, and the selection circuit 129 selects the normal VLC data signal 126 under the control of selection signal 128.

FIG. 4(b) is a timing chart in a case of selecting the VLC data signal generated using the NewLevel signal according to MPEG4.

In FIG. 4(b), when the counter indicates a value of 0 and there comes in all data enabling to start a judgement of the VLC table, a judgement of rising of the start signal tcoef_e is made. As a result of the judgement, when all signals are L when the counter value is 1, and when the signal dec_nomal is L and the signal dec_lmax is H when the counter value is 2, the signal sel_lmax is changed to H regardless of the result of the signal dec_rmax. At this time, the control circuit 127 outputs the selection signal 128 in accordance with the VLC data signal 123 generated using the NewLevel signal, and the selection circuit 129 selects the LMAX data signal 176 under the control of the selection signal 128.

FIG. 4(c) is a timing chart in a case of selecting a VLC data signal generated using the NewRun signal according to MPEG4.

In FIG. 4(c), when the counter indicates a value of 0 and there comes in all data enabling to start a judgement of the VLC table, a judgement of rising of the start signal tcoef_e is made. As a result of the judgement, when all signals are L when the counter value is 1, and when the signal dec_nomal is L, the signal dec_lmax is L and the signal dec_rmax is H when the counter value is 2, the signal sel_rmax is changed to H. At this time, the control circuit 127 outputs the selection signal 128 in accordance with the VLC data signal 116 generated using the NewRun signal, and the selection circuit 129 selects the RMAX data signal 175 under the control of the selection signal 128.

FIG. 4(*d*) is a timing chart in a case of selecting the FLC data signal in MPEG4.

In FIG. 4(*d*), when the counter indicates a value of 0 and there comes in all data enabling to start a judgement of the VLC table, a judgement on rising of the start signal tcoef_e is made. As a result of the judgement, when the signals dec_nomal, dec_lmax and dec_rmax are all L when the counter value is 1 and 2, the signal sel_flc is changed to H. Then, the selection circuit 129 selects the FLC data signal 106.

FIG. 4(*e*) is a timing chart in a case of selecting the normal VLC data signal according to H.263.

In FIG. 4 (*e*), when the counter indicates a value of 0 and there comes in all data enabling to start a judgement of the VLC table, a judgement of rising of the start signal tcoef_e is made. As a result of the judgement, when the signal dec_nomal is H when the counter value is 1, the signal sel_nomal is changed to H, regardless of the results of the signals dec_lmax and dec_rmax. At this time, the control circuit 127 outputs the selection circuit 128 for selecting the normal VLC data signal 126, and the selection circuit 129 selects the normal VLC data signal 126 under the control of the selection signal 128.

FIG. 4(*f*) is a timing chart in a case of selecting the FLC data signal according to H.263.

In FIG. 4(*f*) when the counter indicates a value of 0 and there comes in all data enabling to start a judgement of the VLC table, a judgement on rising of the start signal tcoef_e is made. As a result of the judgement, when the signals dec_nomal, dec_lmax and dec_rmax are all L when the counter value is 1 and 2, the signal sel_flc is changed to H. Then, the selection circuit 129 selects the FLC data signal 106.

Figure 5:
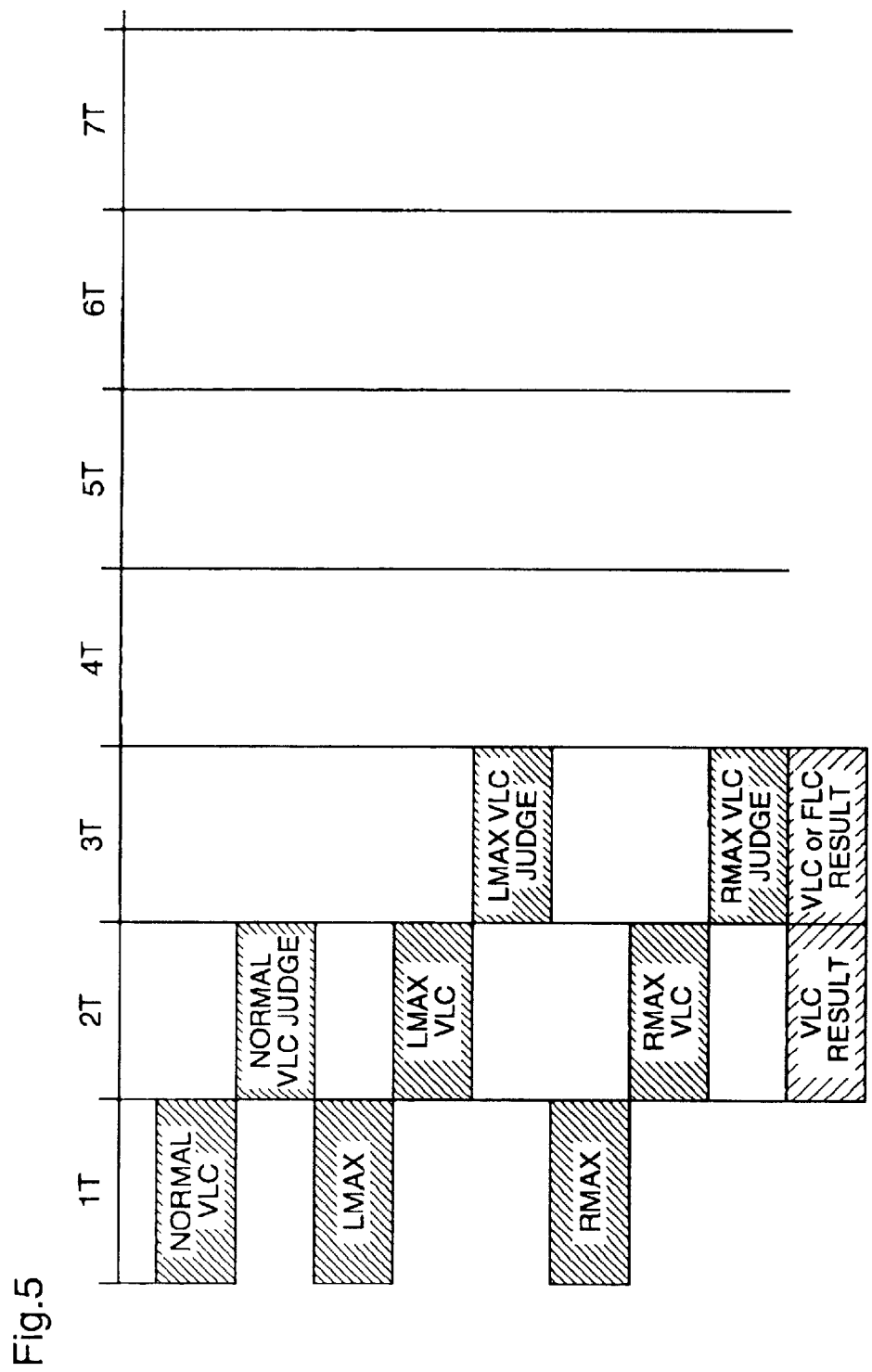
FIG. 5 is a diagram summarizing contents of a process of each cycle according to the second embodiment.

Next, a diagram summarizing the process contents of the above-mentioned timing chart is shown in FIG. 5 and will be described.

Hereinafter, the operation of each cycle is described. The process contents of this figure are shown inside parentheses.

As seen from FIG. 5, in the first cycle (1T), a process of consulting a table with Last, Run and Level is carried out as the normal VLC (NORMAL VLC). In addition, in the same cycle, LMAX as the maximum Level value corresponding to the Last and Run is subtracted from the Level value, thereby obtaining a NewLevel value (LMAX), and the sum of 1 and RMAX as the maximum Run value corresponding to the Last and Level is subtracted from the Run value, thereby obtaining NewRun (RMAX).

Subsequently, in the second cycle (2T), a judgement as to whether the result of the normal VLC exists in the control circuit 127 is made (NORMAL VLC judgement), and when the normal VLC result exists in the control circuit this result is outputted (VLC result). Further, in the same cycle, a VLC process corresponding to the combination of Last, Run and NewLevel is carried out (LMAX VLC), and a VLC process corresponding to the combination of Last, NewRun and Level is carried out (RMAX VLC).

Subsequently, in the third cycle (3T), a judgement as to whether the result of the VLC corresponding to the combination of Last, Run, and NewLevel exists in the control circuit 127 is made (LMAX VLC judgement), and when the LMAX VLC result exists in the control circuit this result is outputted (VLC result). Further, a judgement as to whether the VLC result corresponding to the combination of Last, NewRun and Level exists in the control circuit 127 is made (RMAX VLC judgement), and when the RMAX VLC result exists in the control circuit this result is outputted (VLC result). On the other hand, when it is judged that any of the results do not exits in the control circuit 127, Last, Run and Level are processed by FLC in the same cycle, thereby outputting the obtained result (FLC result).

As described above, according to the variable length coding apparatus of the second embodiment, the processes for the normal VLC data, the VLC data generated using the NewLevel signal and the VLC data generated using the NewRun signal are carried out simultaneously, and the results are outputted according to the preset priorities. Therefore, all the processes can be carried out in three cycles, thereby greatly reducing the number of process cycles.

In the variable length coding apparatus according to the second embodiment, according to the preset priorities, the signals are selected in the order of: normal VLC data, VLC data generated using the NewLevel signal, VLC data generated using the NewRun signal, and FLC data. However, the order of the signal selection is not limited to this order, and the priorities may be set such that the signals are selected in the order of: normal VLC data, VLC data generated using the NewRun signal, VLC data generated using the NewLevel signal, and FLC data. Further, when the priorities are set such that the signals are selected in the order of: normal VLC data and then FLC data, it is possible to carry out the VLC process without selecting VLC data generated using the NewLevel signal or VLC data generated using the NewRun signal. To be more specific, such priorities can also conform to the VLC process of H.263. Further, the priorities of the VLC data generated using the NewLevel signal and the VLC data generated using the NewRun signal can be arbitrarily varied with image data. Thereby, a variable length coding apparatus which reduces the number of cycles in the escape mode can be obtained.

Embodiment 3

A variable length coding apparatus according to a third embodiment of the present invention performs VLC using one VLC table.

Figure 6:
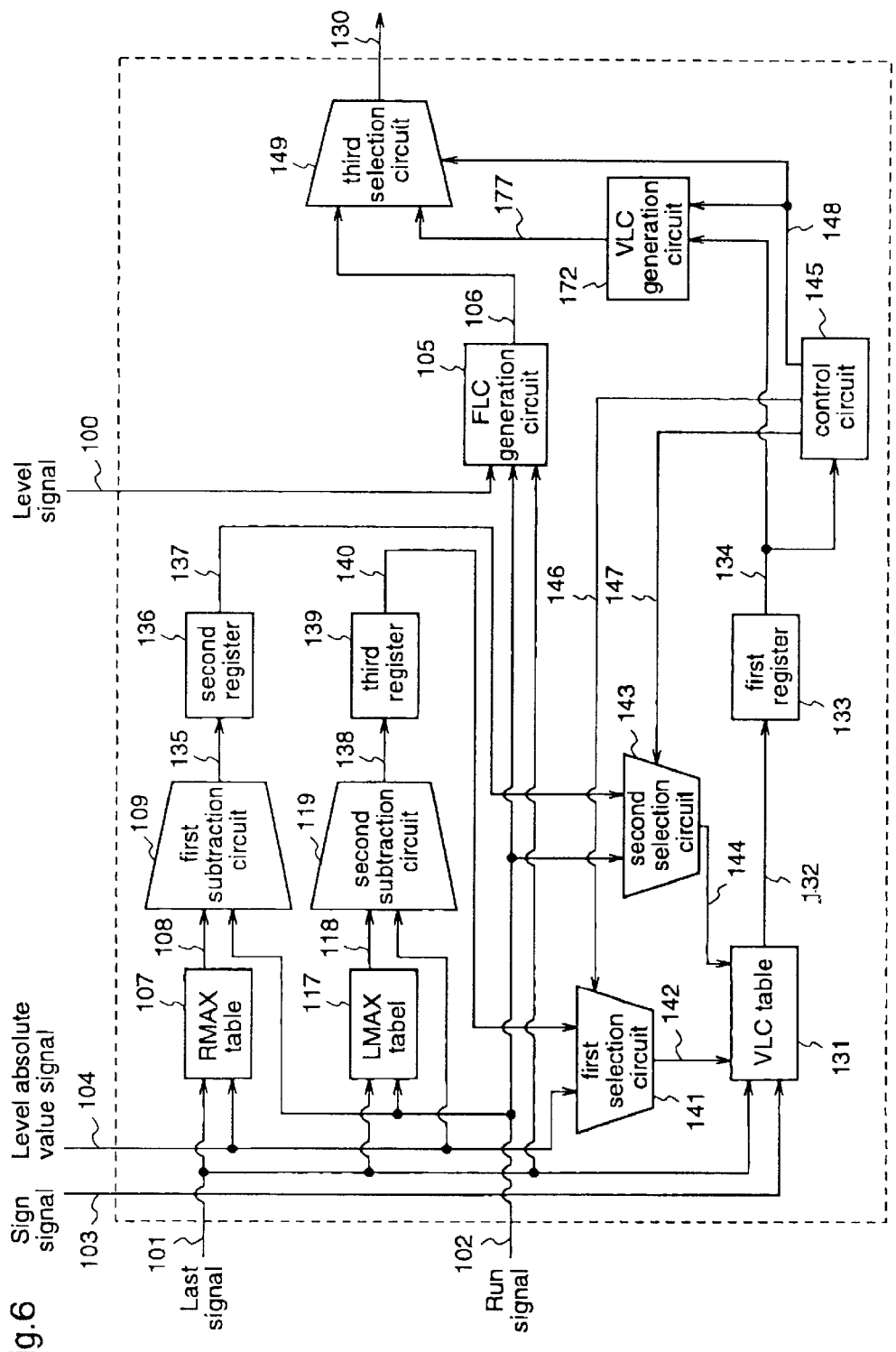
FIG. 6 is a block diagram for explaining a structure of a variable length coding apparatus according to a third embodiment of the present invention.

FIG. 6 is a block diagram for explaining a structure of a variable length coding apparatus of the third embodiment.

In FIG. 6, the same reference numerals as those in FIG. 3 denote the same or corresponding parts. Numeral 135 denotes an output signal of the first subtraction circuit 109. Numeral 136 denotes a second register for holding the output signal 135 of the first subtraction circuit. Numeral 137 denotes a NewRun signal outputted from the second register 136. Numeral 138 denotes an output signal of the second subtraction circuit 119. Numeral 139 denotes a third register for holding the output signal 138 of the second subtraction circuit 119. Numeral 140 denotes a NewLevel signal outputted from the third register 139. Numeral 141 denotes a first selection circuit for selecting one of the Level absolute value signal 104 and the NewLevel signal 140. Numeral 142 denotes an output signal of the first selection circuit 141. Numeral 143 denotes a second selection circuit for selecting one of the Run signal 102 and the NewRun signal 137. Numeral 144 denotes an output signal of the second selection circuit 143. Numeral 131 denotes a VLC table for receiving the Last signal 101, the Sign signal 103, the output signal 142 of the first selection circuit and the output signal 144 of the second selection circuit. Numeral 132 denotes a VLC table output signal outputted from the VLC table 131. Numeral 133 denotes a first register for holding the VLC table output signal 132. Numeral 134 denotes a VLC data signal as an output signal of the first register 133. Numeral 145 denotes a control circuit for receiving the VLC data signal 134. Numeral 146 denotes a first selection signal that controls the first selection circuit 141 for selecting one of the Level absolute value signal 104 and the NewLevel signal 140. Numeral 147 denotes a second selection signal that controls the second selection circuit 143 for selecting one of the Run signal 102 and the NewRun signal 137. Numeral 148 denotes a third selection signal for outputting the VLC data signal 134 selected by the control circuit 145 to the VLC generation circuit 172 and the third selection circuit 149. Numeral 172 denotes a VLC generation circuit for receiving the third selection signal 148 and the VLC data signal 134 and generating coded data. Numeral 177 denotes a generated VLC signal as an output signal of the VLC generation circuit 172. Numeral 149 denotes a third selection circuit for selecting one of tho generated VLC signal 177 and the FLC data signal 106.

Next, the operation of the variable length coding apparatus according to the third embodiment will be described with reference to FIG. 6.

The control circuit 145 controls the first selection circuit 141 by means of the first selection signal 146, and controls the second selection circuit 143 by means of the second selection signal 147. Then, the first selection circuit 141 selects the Level absolute value signal 104 under the control of the first selection signal 146, and outputs the signal 104 to the VLC table 131 as the output signal 142 of the first selection circuit 141. Further, the second selection circuit 143 selects the Run signal 102 under the control of the second selection signal 147, and outputs the signal 102 to the VLC table 131 as the output signal 144 of the second selection circuit 143. The VLC table 131 receives the output signal 142 of the first selection circuit as the Last signal 101, the Sign signal 103 and the Level absolute value signal 104, and the output signal 144 of the second selection circuit as the Run signal 102, performs normal VLC, thereby generating the VLC table output signal 132, and outputs the signal 132 to the first register 133. The first register 133 holds the VLC table output signal 132, and outputs the VLC data signal 134, which is a normal VLC, to the control circuit 145 and the VLC generation circuit 172.

The control circuit 145 receives the VLC data signal 134 as the normal VLC data, and makes a judgement as to whether the VLC data signal is correct in a VLC table. As a result of the judgement, when the VLC data signal 134 is a correct VLC, the control circuit 145 outputs the third selection signal 148 for selecting the VLC data signal 134 to the VLC generation circuit 172 and the third selection circuit 149. The VLC generation circuit 172 outputs the selected VLC data signal 134 to the third selection circuit 149 as the generated VLC signal 177, taking the VLC data signal 134 as normal VLC data. The third selection circuit 149 selects the generated VLC signal 177 under the control of the third selection signal 148, and outputs the signal 177 as the data signal 130.

Next, the LMAX table 117 receives the Last signal 101 and the Run signal 102, generates the LMAX data signal 118, and outputs the LMAX data signal to the second subtraction circuit 119. The second subtraction circuit 119 receives the LMAX data signal 118 and the Level absolute value signal 104, subtracts the LMAX data signal 118 from the Level absolute value signal 104, and outputs the obtained result to the third register 139 as the output signal 138 of the second subtraction circuit. The third register 139 holds the output signal 138 of the second subtraction circuit, and outputs the signal to the first selection circuit 141 as the NewLevel signal 140.

The control circuit 145 controls the first selection circuit 141 by means of the first selection signal 146, and the first selection circuit 141 selects the NewLevel signal 140 and outputs the signal 140 to the VLC table 131 as the output signal 142 of the first selection circuit. Further, the control circuit 145 controls the second selection circuit 143 by means of the second selection signal 147, and the second selection circuit 143 selects the Run signal 102 and outputs the signal 102 to the VLC table 131 as the output signal 144 of the second selection circuit. The VLC table 131 receives the output signal 142 of the first selection circuit as the Last signal 101, the Sign signal 103 and the NewLevel signal 140, and the output signal 144 of the second selection circuit as the Run signal 102, performs LMAX VLC, thereby generating the VLC table output signal 132, and outputs the signal 132 to the first register 133. The first register 133 holds the VLC table output signal 132 as an LMAX VLC.

The control circuit 145 receives the VLC data signal 134 as the LMAX VLC, and makes a judgement as to whether the signal is a correct VLC. As a result of the judgement, when the VLC data signal 134 is a correct VLC, the control circuit 145 outputs the third selection signal 148 for selecting the VLC data signal 134, to the VLC generation circuit 172 and the third selection circuit 149. The VLC generation circuit 172 performs coding by adding an ESC code and a code indicating the LMAX VLC, and outputs the obtained result to the third selection circuit 149 as the generated VLC signal 177. The third selection circuit 149 selects the generated VLC signal 177 under the control of the third selection signal 148, and outputs the signal 177 as the data signal 130.

Further, the RMAX table 107 receives the Last signal 101 and the Level absolute value signal 104, generates an RMAX data signal 108, and outputs the RMAX data signal 106 to the first subtraction circuit 109. The first subtraction circuit 109 receives the RMAX data signal 108 and the Run signal 102, subtracts the sum of the RMAX data signal 108 and 1 from the Run signal 102, and outputs the obtained result to the second register 136 as the output signal 135 of the first subtraction circuit 109. The second register 136 holds the output signal 135 of the first subtraction circuit, and outputs the signal to the second selection circuit 143 as the NewRun signal 137.

The control circuit 145 controls the first selection circuit 141 by means of the first selection signal 146, and the first selection circuit 141 selects the Level absolute value signal 104 and outputs the signal to the VLC table 131 as the output signal 142 of the first selection circuit 141. Further, the control circuit 145 controls the second selection circuit 143 by means of the second selection signal 147, and the second selection circuit 143 selects the NewRun signal 137 and outputs the signal to the VLC table 131 as the output signal 144 of the second selection circuit. The VLC table 131 receives the output signal 142 of the first selection circuit as the Last signal 101, the Sign signal 103 and the Level absolute value signal 104, and the output signal 144 of the second selection circuit as the NewRun signal 137, performs RMAX VLC, thereby generating a VLC table output signal 132, and outputs the VLC table output signal 132 to the first register 133. The first register 133 holds the VLC table output signal 132 as an RMAX VLC.

The control circuit 145 receives the VLC data signal 134 as an RMAX VLC, and makes a judgement as to whether the signal is a correct VLC. As a result of the judgement, when the VLC data signal 134 is a correct VLC, the control circuit 145 outputs the third selection signal 148 for selecting the VLC data signal 134, to the VLC generation circuit 172 and the third selection circuit 149. The VLC generation circuit 172 performs coding by adding an ESC code and a code indicating an RMAX VLC, and outputs the obtained result to the third selection circuit 149 as the generated VLC signal 177. The third selection circuit 149 selects the generated VLC signal 177 under the control of the third selection signal 148, and outputs the signal 177 as the data signal 130.

On the other hand, when the control circuit 145 judges that any of the VLC data signals 134 is not a correct VLC, the third selection circuit 149 selects the FLC data signal 106 and outputs the signal as the data signal 130.

Figure 7:
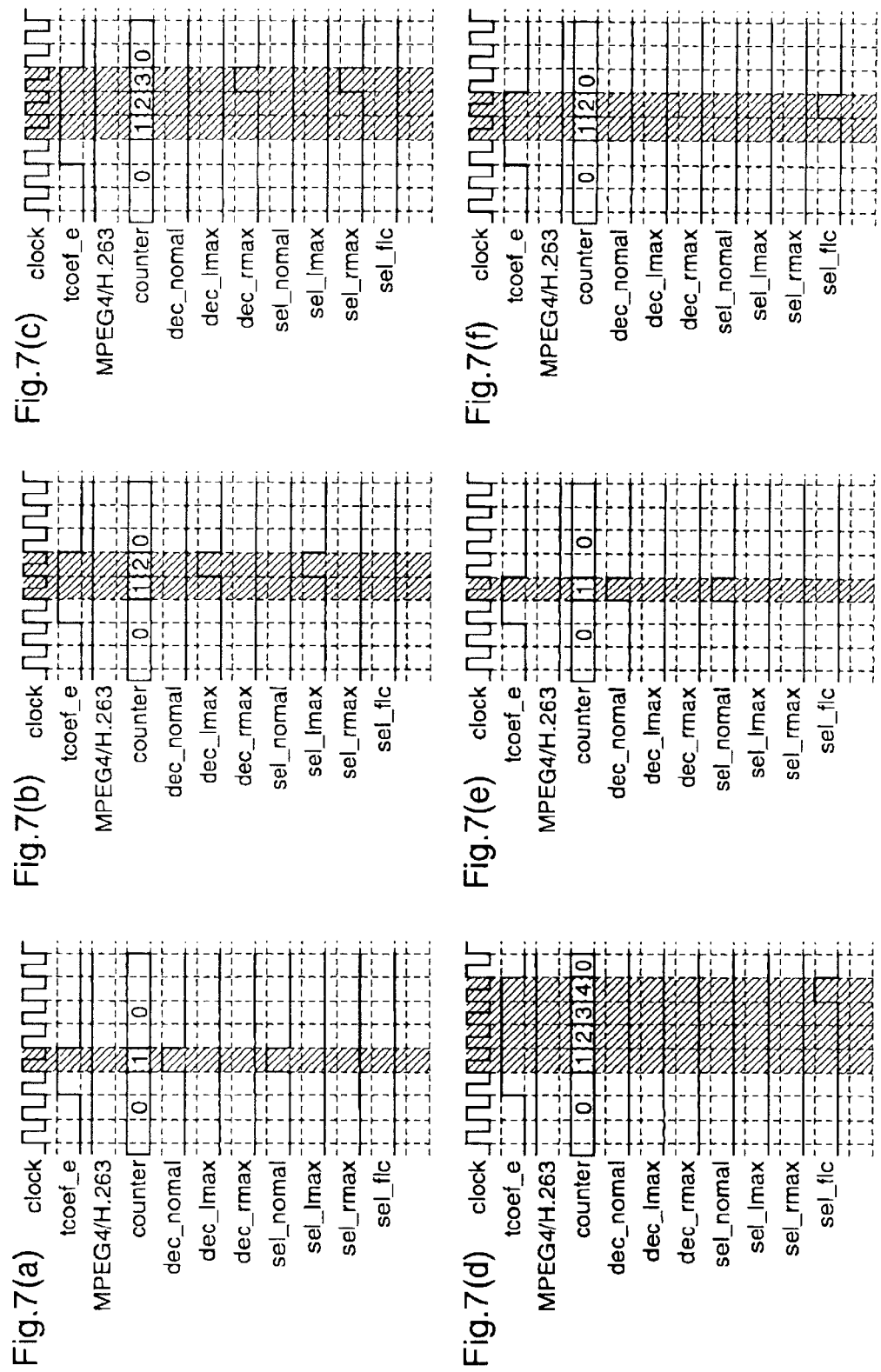
FIG. 7 are timing charts for explaining operations of a control circuit according to the third embodiment.

Next, FIG. 7 are timing charts for explaining an operation of the control circuit according to the third embodiment of the present invention.

In FIG. 7, since the respective designations of the signals are the same as those in FIG. 4, they are not described here.

Then, the respective timing charts will be described.

FIG. 7(a) is a timing chart in a case of selecting a normal VLC data signal according to MPEG4.

In FIG. 7(a), when the counter shows a value of 0 and there comes in all data enabling to start a judgement of a VLC table, a judgement of rising of the start signal tcoef_e is made. As a result of the judgement, when the signal dec_nomal is H when the counter value is 1, the signal sel_nomal is changed to H, regardless of the results of the signals dec_lmax and dec_rmax. At this time, the control circuit 145 outputs the third selection signal 148 for selecting the VLC data signal 134 as a normal VLC, and the third selection circuit 149 selects the generated VLC signal 177 as a normal VLC data signal under the control of the third selection signal 148.

FIG. 7(b) is a timing chart in a case of selecting a VLC data signal generated using a NewLevel signal according to MPEG4.

In FIG. 7(b), when the counter shows a value of 0 and there comes in all data enabling to start a judgement of the VLC table, a judgement of rising of the start signal tcoef_e is made. As a result of the judgement, when all signals are L when the counter value is 1, and the signal dec_nomal is L and the signal dec_lmax is H when the counter value is 2, the signal sel_lmax is changed to H, regardless of the result of the signal dec_rmax. At this time, the control circuit 145 outputs the third selection signal 148 for selecting the VLC data signal 134 that is generated using the NewLevel signal, and the third selection circuit 149 selects the generated VLC signal 177 as the VLC data signal generated using the NewLevel signal, under the control of the third selection signal 148.

FIG. 7(c) is a timing chart in a case of selecting a VLC data signal that is generated using a NewRun signal according to MPEG4.

In FIG. 7(c), when the counter shows a value of 0 and there comes in all data enabling to start a judgement of the VLC table, a judgement of rising of the start signal tcoef_e is made. As a result of the judgement, when all signals are L when the counter value is 1 and 2, and the signal dec_nomal is L, the signal dec_lmax is L and the signal dec_rmax is H when the counter value is 3, the signal sel_rmax is changed to H. At this time, the control circuit 145 outputs the third selection signal 148 for selecting a VLC data signal that is generated using a NewRun signal, and the third selection circuit 149 selects the generated VLC signal 177 as the VLC data signal generated using the NewRun signal, under the control of the third selection signal 148.

FIG. 7(d) is a timing chart in a case of selecting a FLC data signal according to MPEG4.

In FIG. 7(d), when the counter shows a value of 0 and there comes in all data enabling to start a judgement of the VLC table, a judgement of rising of the start signal tcoef_e is made. As a result of the judgement, when all signals are L when the counter value is 1–4, the signal sel_flc is changed to H. Then, the third selection circuit 149 selects the FLC data signal 106.

FIG. 7(e) is a timing chart in a case of selecting a normal VLC data signal according to H.263.

In FIG. 7(e), when the counter shows a value of 0 and there comes in all data enabling to start a judgement of the VLC table, a judgement of rising of the start signal tcoef_e is made. As a result of the judgement, when the signal dec_nomal is H when the counter value is 1, the signal sel_nomal is changed to H, regardless of the results of the signals dec_lmax and dec_rmax. At this time, the control circuit 145 outputs the third selection signal 148 for selecting the VLC data signal 134 as a normal VLC, and the third selection circuit 149 selects the generated VLC signal 177 as the normal VLC data signal, under the control of the third selection signal 148.

FIG. 7(f) is a timing chart in a case of selecting a FLC data signal according to H.263.

In FIG. 7(f), when the counter shows a value of 0 and there comes in all data enabling to start a judgement of the VLC table, a judgement of rising of the start signal tcoef_e is made. As a result of the judgement, when all signals are L when the counter value is 1 and 2, the signal sel_flc is changed to H. Then, the third selection circuit 149 selects the FLC data signal 106.

Figure 8:
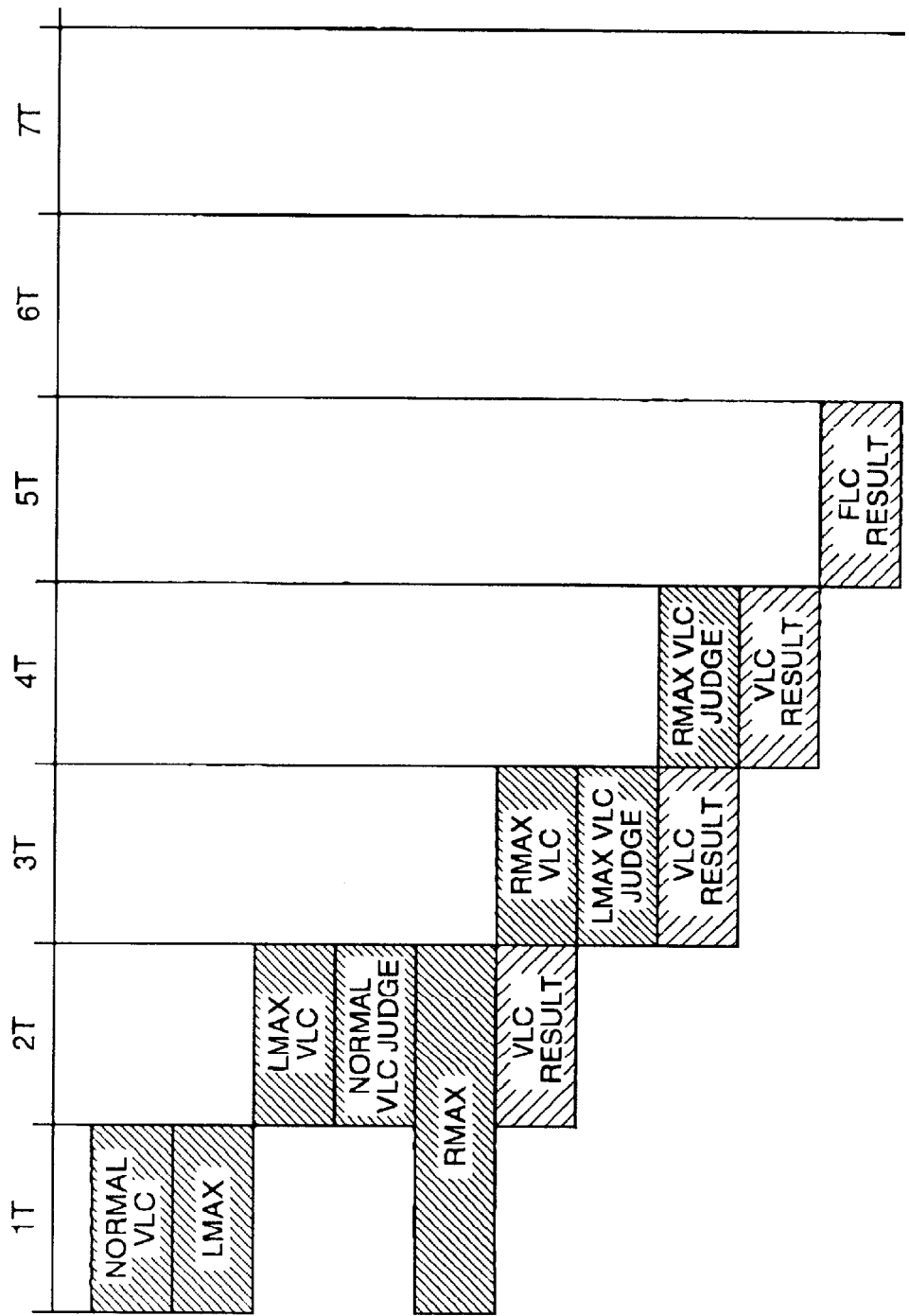
FIG. 8 is a diagram summarizing contents of a process of each cycle when a process is carried out in 5T according to the third embodiment.

Next, a diagram summarizing the process contents in the above-mentioned timing chart is shown in FIG. 8.

FIG. 8 is a diagram summarizing the process contents of each cycle according to the third embodiment.

Hereinafter, the operation of each cycle will be described. The process contents in this figure are shown inside parentheses.

As seen from FIG. 8, in the first cycle (1T), a process of consulting a table with Last, Run and Level as normal VLC is carried out (NORMAL VLC). In addition, in the same cycle, LMAX as the maximum Level value corresponding to Last and Run is subtracted from the Level value, thereby obtaining NewLevel (LAX), and the sum of 1 and RMAX as the maximum Run value corresponding to Last and Level is subtracted from the Run value, thereby obtaining NewRun (RMAX).

In the second cycle (2T), a judgement as to whether the result of the normal VLC exists in the control circuit 145 is made (NORMAL VLC judgement), and when the normal VLC result exists in the control circuit this result is outputted (VLC result). Further, in the same cycle, VLC corresponding to the combination of Last, Run and NewLevel is carried out (LMAX VLC).

In the third cycle (3T), a judgement as to whether the result of VLC corresponding to the combination of Last, Run and NewLevel exists in the control circuit 145 is made (LMAX VLC judgement), and when the LMAX VLC result exists in the control circuit this result is outputted (VLC result). Further, in the same cycle, VLC corresponding to the combination of Last, NewRun and Level is carried out (RMAX VLC).

In the fourth cycle (4T), a judgement as to whether the result of VLC corresponding to the combination of Last, NewRun and Level exists in the control circuit 145 is made (RMAX VLC judgement), and when the RMAX VLC result exists in the control circuit this result is outputted (VLC result).

In the fifth cycle (5T), when it is judged that any of the above-mentioned VLC results does not exist in the control circuit 145, Last, Run and Level are processed by FLC, and the result is outputted (FLC result).

Further, according to the above-mentioned structure of FIG. 8, the RMAX VLC judgement is made in the fourth cycle, and when the RMAX VLC result does not exists in the control circuit 145 the FLC data is outputted in the fifth cycle. However, it is also possible to make the RMAX VLC judgement in the fourth cycle while simultaneously outputting the FLC data. A diagram which summarizes process contents of each cycle in a case of performing the operations in FIG. 8 in the fourth cycle is shown in FIG. 9.

Figure 9:
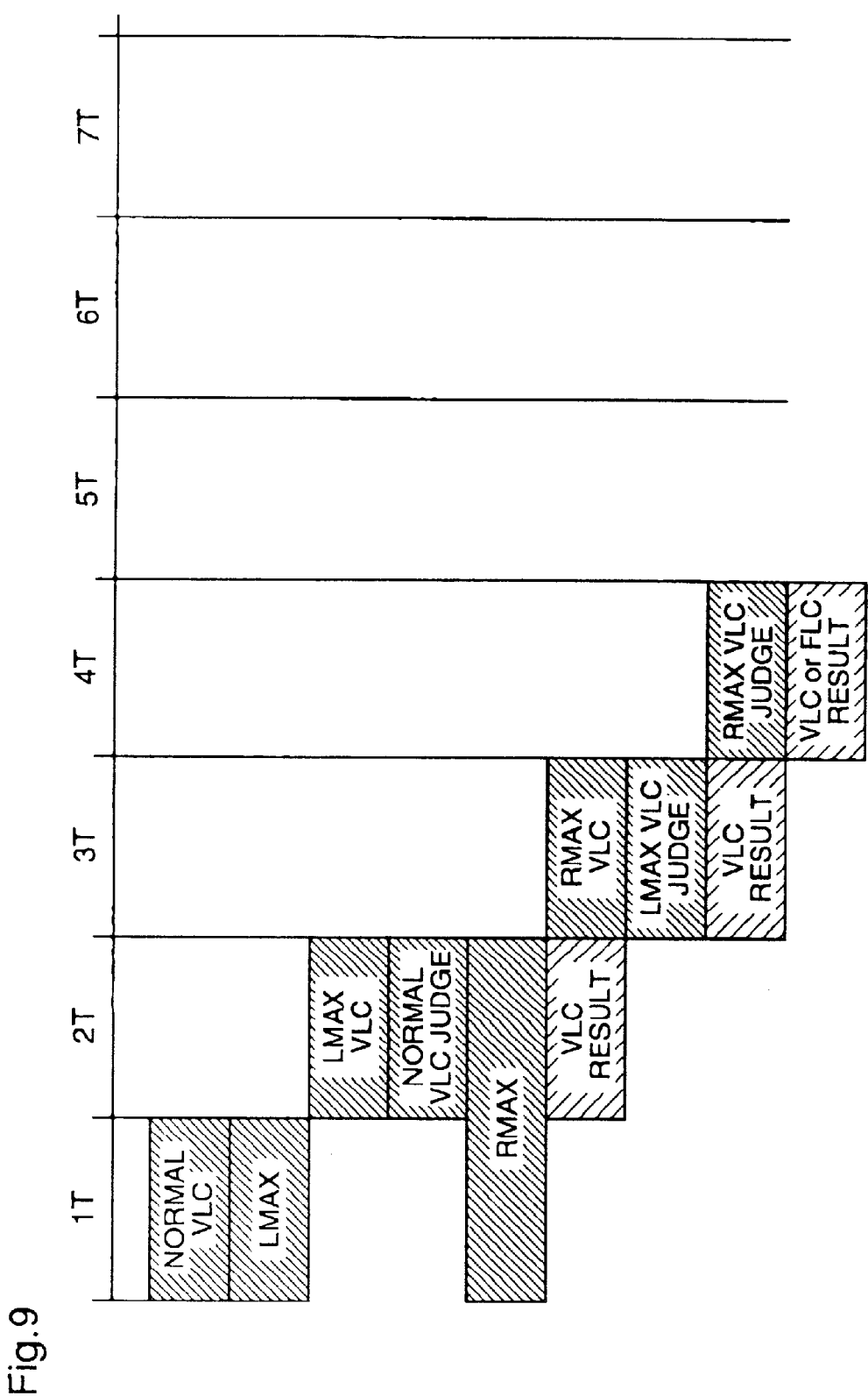
FIG. 9 is a diagram summarizing contents of a process of each cycle when processes are carried out in 4T according to the third embodiment.

The difference of FIG. 9 from FIG. 8 is that when the process of the fourth cycle (4T) is started the RMAX VLC judgement is made, and when the RMAX VLC result exists in the control circuit 145 this result is outputted, while when the RMAX VLC result does not exist in the control circuit 145 the FLC data is outputted in the same cycle, thereby finishing the processes.

As described above, according to the variable length coding apparatus of the third embodiment, the normal VLC is performed while simultaneously an LMAX VLC and an RMAX VLC are generated, and when the VLC data signal is judged to be correct, the judgement of the LMAX VLC and RMAX VLC is not made. Therefore, it is possible to calculate the NewLevel signal and the NewRun signal while performing the normal VLC. In addition, the VLC process conventionally requires six cycles, while according to the third embodiment the number of process cycles can be reduced to four cycles or five cycles. Further, in the prior art, the processes are carried out using three VLC tables, while according to the third embodiment the VLC can be performed using one VLC table, whereby the circuit area can be reduced.

In the variable length coding apparatus according to the third embodiment, according to the preset priorities, the signals are selected in the order of: normal VLC data, VLC data generated using a NewLevel signal, VLC data generated using a NewRun signal, FLC data. However, the order in which the signals are selected is not limited this order. The priorities may be decided such that the signals are selected in the following order of: normal VLC data, VLC data generated using a NewRun signal, VLC data generated using a NewLevel signal, FLC data. Further, when the priorities are decided such that the signals are selected in the order of normal VLC data and FLC data, the VLC process can be carried out without selecting VLC data generated using the NewLevel signal or the VLC data generated using the NewRun signal. That is, such priorities can also conform to the VLC process according to H.263. Further, the priorities of the VLC data generated using the NewLevel signal and the VLC data generated using the NewRun signal can be arbitrarily varied with image data. Thereby, a variable length coding apparatus which reduces the number of cycles in the escape mode can be obtained.

Further, according to the variable length coding apparatus of the third embodiment, the counter is controlled for counting the number of incorrect VLC codes, whereby the priorities can be arbitrarily set. To be more specific, in FIG. 7, the counter outputs VLC data in the order of: normal VLC data, VLC data generated using the NewLevel signal, VLC data generated using the NewRun signal, and FLC data, while the counter can be controlled to set the order of priorities as normal VLC data, VLC data generated using the NewRun signal, VLC data generated using the NewLevel signal, and FLC data. Even when the setting is changed to such order, the same effects as those described above can be obtained. Further, when the priorities are set in the order of: normal VLC data, FLC data, the processes conforming to H.263 can be carried out.

Embodiment 4

A variable length coding apparatus according to a fourth embodiment of the present invention performs VLC using one VLC table as well as does not access needless processes.

Figure 10:
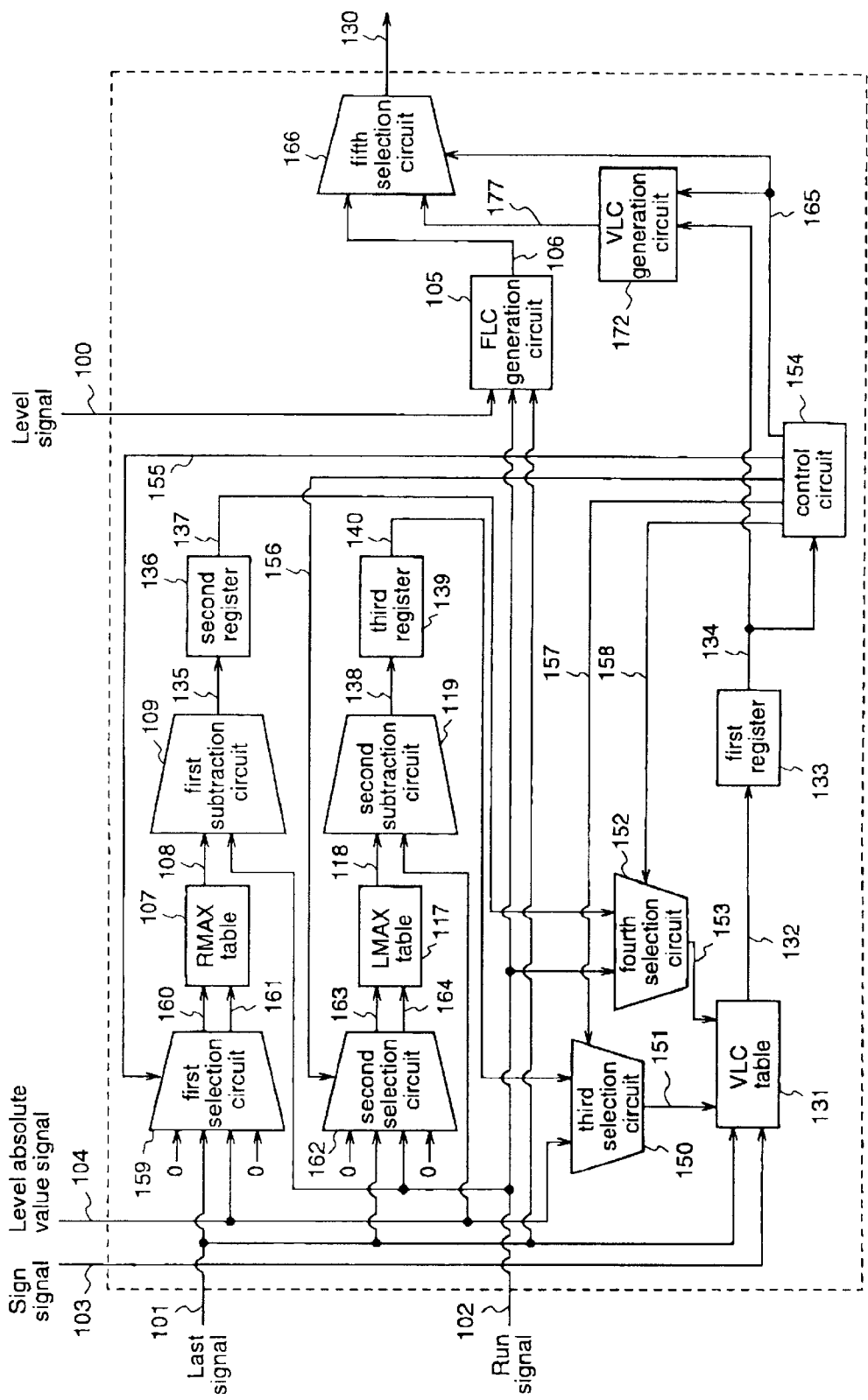
FIG. 10 is a block diagram for explaining a structure of a variable length coding apparatus according to a fourth embodiment of the present invention.

FIG. 10 is a block diagram for explaining a structure of the variable length coding apparatus according to the fourth embodiment.

In FIG. 10, the same reference numerals as those in FIG. 6 denote the same or corresponding parts. Numeral 150 denotes a third selection circuit for selecting one of the Level absolute value signal 104 and the NewLevel signal 140. Numeral 151 denotes an output signal of the third selection circuit 150. Numeral 152 denotes a fourth selection circuit for selecting one of the Run signal 102 and the NewRun signal 137. Numeral 153 denotes an output signal of the fourth selection circuit 152. Numeral 154 denotes a control circuit for receiving the VLC data signal 134. Numeral 157 denotes a third selection signal that controls the third selection circuit 150, thereby selecting one of the Level absolute value signal 104 and the NewLevel signal 140. Numeral 158 denotes a fourth selection signal that controls the fourth selection circuit 152, thereby selecting one of the Run signal 102 and the NewRun signal 137. Numeral 159 denotes a first selection circuit for receiving the Level absolute value signal 104, the Last signal 101 and fixed values. Numeral 160 denotes a first output signal which is the Level absolute value signal 104 or the fixed value outputted from the first selection circuit 159. Numeral 161 denotes a second output signal which is the Last signal 101 or the fixed value outputted from the first selection circuit 159. Numeral 162 denotes a second selection circuit for receiving the Run signal 102, the Last signal 101 and fixed values. Numeral 163 denotes a third output signal which is the Run signal 102 or the fixed value outputted from the second selection circuit 162. Numeral 164 denotes a fourth output signal which is the Last signal 101 or the fixed value outputted from the second selection circuit 162. Numeral 155 denotes a first selection signal for controlling the first selection circuit 159, thereby selecting a signal that is to be outputted from the Level absolute value signal 104, the Last signal 101 and the fixed values. Numeral 156 denotes a second selection signal for controlling the second selection circuit 162, thereby selecting a signal that is to be outputted from the Run signal 102, the Last signal 101 and the fixed values. Numeral 165 denotes a fifth selection signal for outputting the VLC data signal 134 selected by the control circuit 154 to the VLC generation circuit 172 and the fifth selection circuit 166. Numeral 166 denotes a fifth selection circuit for selecting one of the generated VLC signal 177 and the FLC data signal 106.

Next, the operation of the variable length coding apparatus according to the fourth embodiment will be described with reference to FIG. 10.

The control circuit 154 controls the third selection circuit 150 by means of the third selection signal 157, and the fourth selection circuit 152 by means of the fourth selection signal 158. Then, the third selection circuit 150 selects the Level absolute value signal 104 under the control of the third selection signal 157, and outputs the selected signal to the VLC table 131 as the output signal 151 of the third selection circuit. The fourth selection circuit 152 is controlled by the fourth selection signal 158, thereby selecting the Run signal 102, and outputs the selected signal to the VLC table 131 as the output signal 153 of the fourth selection circuit. The VLC table 131 receives the Last signal 101, the Sign signal 103, the output signal 151 of the third selection circuit as the Level absolute value signal 104, and the output signal 153 of the fourth selection circuit as the Run signal 102, then performs normal VLC, thereby generating the VLC table output signal 132, and outputs the generated signal 132 to the first register 133. The first register 133 holds the VLC table output signal 132, and outputs the VLC data signal 134 as the normal VLC to the control circuit 154 and the VLC generation circuit 172.

The control circuit 154 receives the VLC data signal 134 as the normal VLC data, and makes a judgement as to whether this signal is correct or not in the VLC table. As a result of the judgement, when the VLC data signal 134 is a correct VLC, the control circuit 154 outputs the fifth selection signal 165 for selecting the VLC data signal 134, to the VLC generation circuit 172 and the fifth selection circuit 166. The VLC generation circuit 172 outputs the selected VLC data signal 134 to the fifth selection circuit 166 as a generated VLC signal 177, with taking the VLC data signal 134 as normal VLC data. The fifth selection circuit 166 selects the generated VLC signal 177 under the control of the fifth selection signal 165, and outputs the selected signal 177 as the data signal 130.

Next, the control circuit 154 controls the second selection circuit 162 by means of the second selection signal 156. The second selection circuit 162 selects the Run signal 102 and the Last signal 101 under the control of the second selection signal 156, and outputs the selected signals to the LMAX table 117 as the third output signal 163 and the fourth output signal 164, respectively. The LMAX table 117 receives the third output signal 163 and the fourth output signal 164, generates an LMAX data signal 118, and outputs the generated signal 118 to the second subtraction circuit 119. The second subtraction circuit 119 receives the LMAX data signal 118 and the Level absolute value signal 104, subtracts the LMAX data signal 118 from the Level absolute value 104, and outputs the obtained result to the third register 139 as the output signal 138 of the second subtraction circuit. The third register 139 holds the output signal 138 of the second subtraction circuit, and outputs the signal to the third selection circuit 150 as a NewLevel signal 140.

The control circuit 154 controls the third selection circuit 150 by means of the third selection signal 157, and controls the fourth selection circuit 152 by means of the fourth selection signal 158 The third selection circuit 150 selects the NewLevel signal 140 under the control of the third selection signal 157, and outputs the signal to the VLC table 131 as the output signal 151 of the third selection circuit. Further, the fourth selection circuit 152 selects the Run signal 102 under the control of the fourth selection signal 158, and outputs the signal to the VLC table 131 as the output signal 153 of the fourth selection circuit. The VLC table 131 receives the Last signal 101, the Sing signal 103, the output signal 151 of the third selection circuit as the NewLevel signal 140 and the output signal 153 of the fourth selection circuit as the Run signal 102, performs LMAX VLC, thereby generating a VLC table output signal 132, and outputs the signal 132 to the first register 133. The first register 133 holds the VLC table output signal 132 as an LMAX VLC.

The control circuit 154 receives the VLC data signal 134 as LMAX data, and makes a judgement as to whether the signal is a correct VLC. As a result of the judgement, when the VLC data signal 134 is a correct VLC, the control circuit 154 outputs the fifth selection signal 165 for selecting the VLC data signal 134, to the VLC generation circuit 172 and the fifth selection circuit 166. The VLC generation circuit 172 adds an ESC code and a code indicating the VLC of LMAX, to perform coding, and outputs a generated VLC signal 177 to the fifth selection circuit 166. The fifth selection circuit 166 selects the generated VLC signal 177 under the control of the fifth selection signal 165, and outputs the selected signal as the data signal 130.

Further, the control circuit 154 controls the first selection circuit 159 by means of the first selection signal 155. The first selection circuit 159 selects the Level absolute value signal 104 and the Last signal 101 under the control of the first selection signal 155, and outputs the selected signals to the RMAX table 107 as the first output signal 160 and the second output signal 161, respectively. The RMAX table 107 receives the first output signal 160 and the second output signal 161, generates an RMAX data signal 108, and outputs the signal 108 to the first subtraction circuit 109. The first subtraction circuit 109 receives the RMAX data signal 108 and the Run signal 102, subtracts the sum of the RMAX data signal 108 and 1, from the value of the Run signal 102, and outputs the obtained result to the second register 136 as the output signal 135 of the first subtraction circuit. The second register 136 holds the output signal 135 of the first subtraction circuit, and outputs the signal to the fourth selection circuit 152 as a NewRun signal 137.

The control circuit 154 controls the third selection circuit 150 by means of the third selection signal 157 and the fourth selection circuit 152 by means of the fourth selection signal 158. The third selection circuit 150 selects the Level absolute value signal 104 under the control of the third selection signal 157, and outputs the selected signal to the VLC table 131 as the output signal 151 of the third selection circuit. The fourth selection circuit 152 selects the NewRun signal 137 under the control of the fourth selection signal 158, and outputs the selected signal to the VLC table 131 as the output signal 153 of the fourth selection circuit. The VLC table 131 receives the Last signal 102, the Sign signal 103, the output signal 151 of the third selection circuit as the Level absolute value signal 104, and the output signal 153 of the fourth selection circuit as the NewRun signal 137, then performs RMAX VLC, thereby generating a VLC table output signal 132, and outputs the generated signal 132 to the first register 133. The first register 133 holds the VLC table output signal 132 as an LMAX VLC.

The control circuit 154 receives the VLC data signal 134 as the RMAX VLC, and makes a judgement as to whether the signal is a correct VLC or not. As a result of the judgement, when the VLC data signal 134 is a correct VLC, the control circuit 154 outputs the fifth selection signal 165 for selecting the VLC data signal 134, to the VLC generation circuit 172 and the fifth selection circuit 166. The VLC generation circuit 172 adds the ESC code and a code indicating the VLC of RMAX, to perform coding, and outputs a generated VLC signal 177 to the fifth selection circuit 166. The fifth selection circuit 166 selects the generated VLC signal 177 under the control of the fifth selection signal 165, and outputs the signal as the data signal 130.

On the other hand, when it is judged in the control circuit 154 that no VLC data signal 134 is a correct VLC, the fifth selection circuit 166 selects the FLC data signal 106 and outputs the selected signal as the data signal 130.

Figure 11:
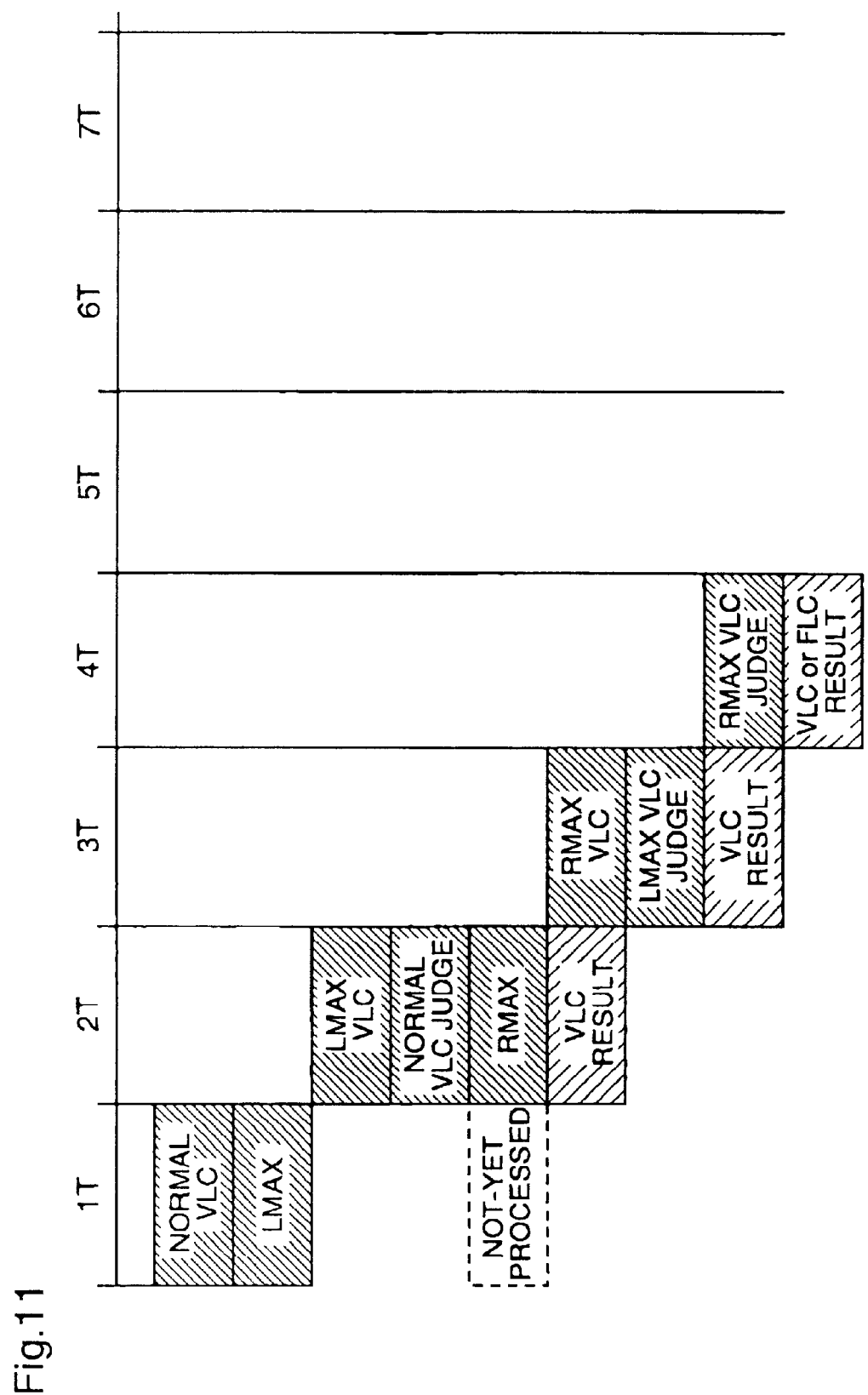
FIG. 11 is a diagram summarizing contents of processes of each cycle according to the fourth embodiment.
Figure 12:
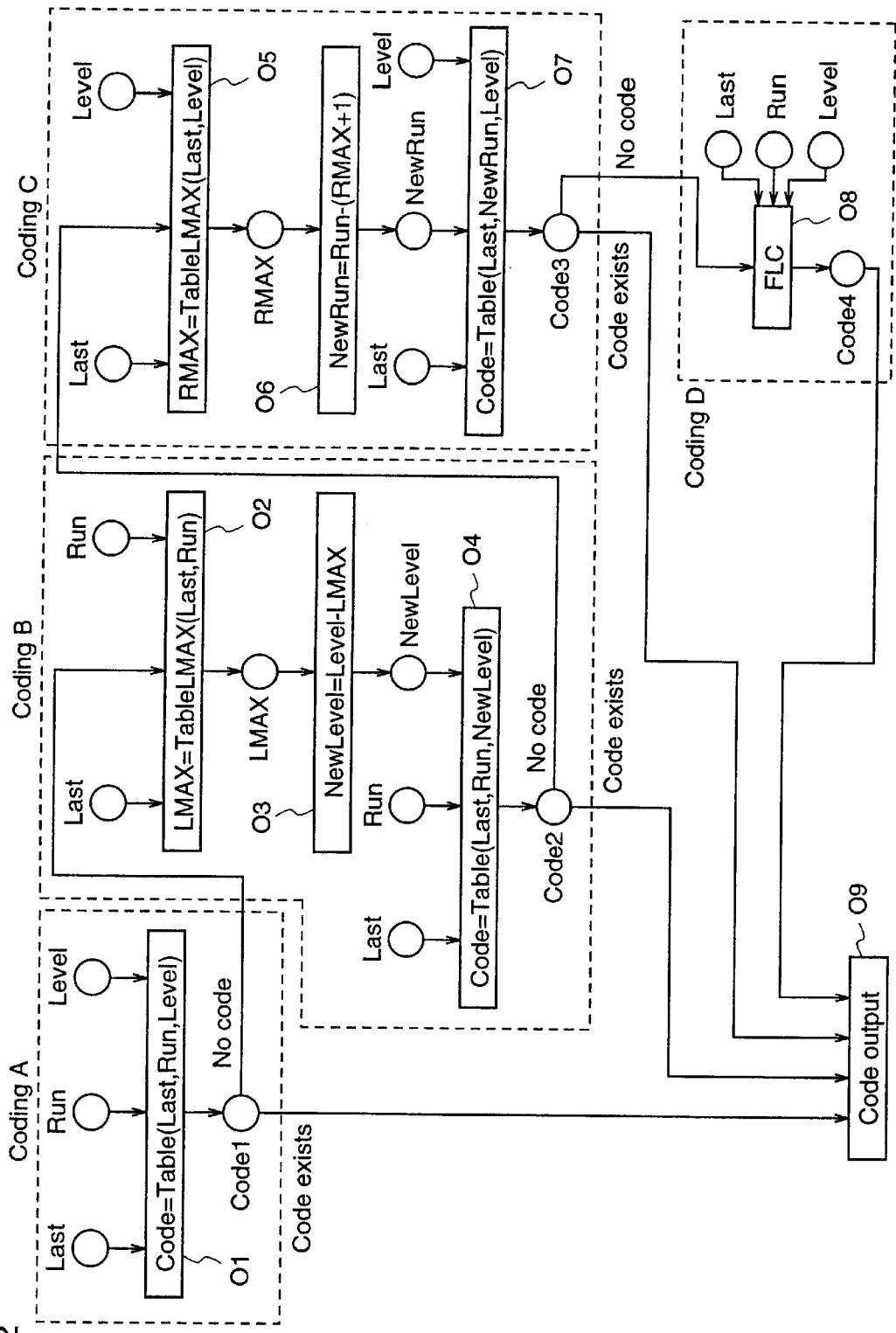
FIG. 12 is a chart diagram for explaining a prior art variable length coding method.
Figure 13:
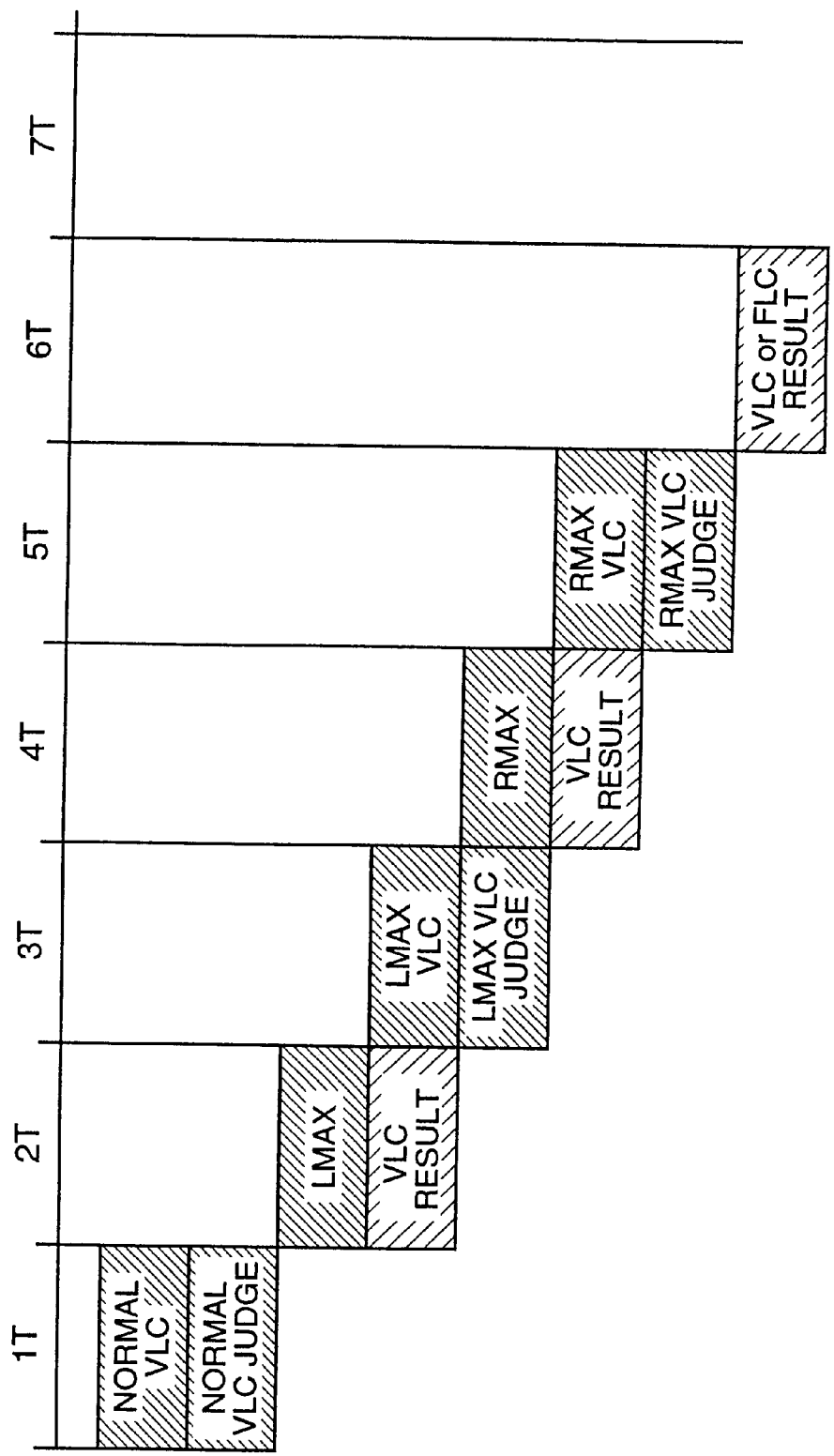
FIG. 13 is a diagram summarizing contents of processes of each cycle according to the prior art variable length coding method.

Next, a diagram summarizing process contents of each cycle according to the fourth embodiment of the present invention is shown in FIG. 11.

Hereinafter, the operation of each cycle will be described. Here, the process contents in the figure are shown inside parentheses.

As shown in FIG. 11, in the first cycle (1T), a process of consulting a table with Last, Run and Level as the normal VLC is carried out (NORMAL VLC). Further, in the same cycle, LMAX as the maximum Level value corresponding to Last and Run is subtracted from the Level value, thereby obtaining NewLevel (LMAX).

In the second cycle (2T), a judgement as to whether the result of the normal VLC exists in the control circuit 154 is made (NORMAL VLC judgement) and when the normal VLC result exists, this result is outputted (VLC result). In the same cycle, the sum of 1 and RMAX as the maximum Run value corresponding to Last and Level is subtracted from the Run value, thereby obtaining NewRun (RMAX). Further, VLC corresponding to the combination of Last, Run, NewLevel is carried out (LMAX VLC).

In the third cycle (3T), a judgement as to whether the result of VLC corresponding to the combination of Last, Run and NewLevel exists in the control circuit 154 is made (LMAX VLC judgement) and when the LMAX VLC result exists, this result is outputted (VLC result). Further, in the same cycle, VLC corresponding to the combination of Last, NewRun and Level is performed (RMAX VLC).

In the fourth cycle (4T), a judgement as to whether the result of VLC corresponding to the combination of Last, NewRun and Level exists in the control circuit 154 or not is made (RMAX VLC judgement) and when the result of the RMAX VLC exists, this result is outputted (VLC result). On the other hand, when it is judged that any of the above-mentioned VLC results does not exists in the control circuit 154, Last, Run and Level are processed with a FLC and the result is outputted (FLC result).

As described above, according to the variable length coding apparatus of the fourth embodiment, the normal VLC is performed while simultaneously the NewLevel signal is calculated, and then the NewRun signal is calculated in the second cycle in which the first escape mode is executed. Therefore, the RMAX table is never accessed in the first cycle, thereby reducing the consumed power. Further, the prior art VLC process requires six cycles, while according to the fourth embodiment the number of process cycles can be reduced to four cycles. Further, in the prior art the processes are carried out using three VLC tables, while this embodiment enables the VLC with one VLC table, thereby reducing the circuit area.

According to the variable length coding apparatus of the fourth embodiment, the signals are selected according to the preset priorities, i.e., in the order of: normal VLC data, VLC data generated using a NewLevel signal, VLC data generated using a NewRun signal, and FLC data. However, the order of selecting signals is not limited to this order, and the signals may be selected according to priorities in the order of: normal VLC data, VLC data generated using a NewRun signal, VLC data generated using a NewLevel signal, and FLC data. Further, when the priorities are set so as to select tho normal VLC data and then the FLC data, the VLC process can be carried out without selecting the VLC data generated using the NewLevel signal or the VLC data generated using the NewRun signal. To be more specific, such priority can conform also to the VLC process according to H.263. Further, the priorities of the VLC data generated using the NewLevel signal and the VLC data generated using the NewRun signal may be arbitrarily varied with image data. Thereby, a variable length coding apparatus that has a reduced number of cycles in the escape mode can be obtained.

Industrial Availability

A variable length coding method and a variable length coding apparatus according to the present invention can reduce the number of arithmetic cycles and efficiently carry out a variable length coding process, whereby it is especially suitable to a compression process for moving pictures which are compliant with standards such as MPEG4 or H.263.

What is claimed is:

1. A variable length coding (VLC) method by which Run as the number of preceding zero coefficients, Level as a value of a non-zero coefficient, and Last indicating whether the non-zero coefficient is the last one from discrete cosine transform coefficients which are rearranged in an one-dimensional array are taken as a combination of (Last, Run, Level), a VLC process of assigning a unique code to the combination is carried out, and when the VLC assignment cannot be performed, three escape modes are applied, thereby performing coding, comprising:

process (a) performing the code assignment for the combination of (Last, Run, Level);

process (b), as a first escape mode, subtracting LMAX as a maximum Level corresponding to (Last, Run) from Level, and performing code assignment for a combination including an obtained amended Level of (Last, Run, amended Level);

process(c), as a second escape mode, subtracting a value that is obtained by adding RMAX as a maximum Run corresponding to (Last, Level) and 1 from Run, and performing code assignment for a combination including an obtained amended Run of (Last, amended Run, Level); and process(d), as a third escape mode, assigning a fixed length code (FLC), wherein processes (a) to (d) are carried out in parallel with each other, and process(e) selecting the codes assigned in said processes (a) to (d) in the prioritized order: (a), (b), (c), (d), and outputting the selected codes.

2. The variable length coding method of claim 1, wherein the prioritized order by which coded data is selected is decided by said process (e) selecting one of three orders: (a), (b), (c), (d); (a), (c), (b), (d); and (a), (d).

3. A variable length coding (VLC) apparatus comprising an RMAX table for receiving a Level absolute value signal as an absolute value of a Level signal and a Last signal; an LMAX table for receiving a Run signal and the Last signal; a first VLC table for receiving the Level absolute value signal, a signal indicating the sign of the Level signal, the Run signal, and the Last signal; a first subtraction circuit for subtracting a sum of an output signal of the RMAX table and 1, from the Run signal; a second register for holding an output signal of the first subtraction circuit; a second VLC table for receiving an output signal of the second register, the Level absolute value signal, the signal indicating the sign of the Level signal, and the Last signal; a second subtraction circuit for subtracting an output signal of the LMAX table from the Level absolute value signal; a third register for holding an output signal of the second subtraction circuit; a third VLC table for receiving an output signal of the third register, the signal indicating the sign of the Level signal, the Run signal, and the Last signal; a first register for holding an output signal of the first VLC table; a fourth register for holding an output signal of the second VLC table; a fifth register for holding an output signal of the third VLC table; an RMAX VLC generation circuit for receiving an output signal of the fourth register; an LMAX VLC generation circuit for receiving an output signal of the fifth register; a fixed length code (FLC) generation circuit for receiving the Level signal, the Run signal, and the Last signal; a control circuit for receiving an output signal of the first register, the output signal of the fourth register, and the output signal of the fifth register; and a selection circuit for receiving the output signal of the first register, an output signal of the RMAX VLC generation circuit, an output signal of the LMAX VLC generation circuit, and an output signal of the FLC generation circuit, wherein the control circuit judges whether the output signal of the first register, the output signal of the fourth register, and the output signal of the fifth register are correct VLCs, and outputs a selection signal for indicating the judgement result to the selection circuit, and the selection circuit selects one output signal from the output signal of the first register, the output signal of the RMAX VLC generation circuit, the output signal of the LMAX VLC generation circuit, and the output signal of the FLC generation circuit, in accordance with the selection signal, and outputs the selected signal as a code.

4. The variable length coding apparatus of claim 3 wherein the control circuit judges whether the output signal of the first register, the output signal of the fourth register, and the output signal of the fifth register are correct VLCs, and outputs the judgement result to the selection circuit according to preset priorities.

5. A variable length coding (VLC) apparatus comprising an RMAX table for receiving a Level absolute value signal as an absolute value of a Level signal and a Last signal; an LMAX table for receiving a Run signal and the Last signal; a first subtraction circuit for subtracting a sum of an output signal of the RMAX table and 1, from the Run signal; a second subtraction circuit for subtracting an output signal of the LMAX table from the Level absolute value signal; a second register for holding an output signal of the first subtraction circuit; a third register for holding an output signal of the second subtraction circuit; a first selection circuit for selecting one of an output signal of the third register and the Level absolute value signal; a second selection circuit for selecting one of an output signal of the second register and the Run signal; a VLC table for receiving an output signal of the first selection circuit, an output signal of the second selection circuit, a signal indicating the sign of the Level signal, and the Last signal; a first register for holding an output signal of the VLC table, a fixed length code (FLC) generation circuit for receiving the Level signal, the Run signal, and the Last signal; a control circuit for receiving an output signal of the first register; a VLC generation circuit for receiving the output signal of the first register, and an output signal of the control circuit; and a third selection circuit for receiving an output signal of the VLC generation circuit and an output signal of the FLC generation circuit, wherein in a first cycle, the first selection circuit receives a first selection signal outputted from the control circuit, selects the Level absolute value signal, and outputs the Level absolute value signal to the VLC table, the second selection circuit receives a second selection signal outputted from the control circuit, selects the Run signal, and outputs the Run signal to the VLC table, then the VLC table implements VLC, outputs an output signal to the first register, and in a second cycle, the control circuit judges whether the output signal of the first register is correct as a normal VLC, and when the output signal of the first register is judged to be correct as a normal VLC, outputs a third selection signal indicating the judgement result to the VLC generation circuit and the third selection circuit, the VLC generation circuit outputs the output signal of the first register as a normal VLC code, and the third selection circuit selects the output signal of the VLC generation circuit in accordance with the third selection signal and outputs the selected signal, in the first cycle, the LMAX table receives the Last signal and the Run signal, generates an LMAX data signal, and outputs the LMAX data signal to the second subtraction circuit, the second subtraction circuit receives the LMAX data signal and the Level absolute value signal, subtracts the LMAX data signal from the Level absolute value signal, and outputs an obtained result to the third register, and in the second cycle, the first selection circuit receives the first selection signal outputted from the control circuit, selects the output signal of the third register, and outputs the selected signal to the VLC table, the second selection circuit receives the second selection signal outputted from the control circuit, selects the Run signal, and outputs the selected Run signal to the VLC table, then the VLC table implements VLC, outputs an output signal to the first register, and in the third cycle, when the judgement of the normal VLC performed in the second cycle shows that the output signal is not correct, the control circuit judges whether the output signal of the first register is correct as LMAX VLC, and when the output signal of the first register is judged to be correct as LMAX VLC, outputs the third selection signal indicating the judgement result to the VLC generation circuit and the third selection circuit, the VLC generation circuit outputs the output signal of the first register as an LMAX VLC code, and the third selection circuit selects the output signal of the VLC generation circuit in accordance with the third selection signal and outputs the selected signal, and in the first cycle, the RMAX table receives the Last signal and the Level absolute value signal, generates an RMAX data signal, and outputs the PMAX data signal to the first subtraction circuit, the first subtraction circuit receives the RMAX data signal and the Run signal, subtracts a value that is obtained by adding the RMAX data signal and 1, from the Run signal, and outputs an obtained result to the second register, and in the third cycle, the first selection circuit receives the first selection signal outputted from the control circuit, selects the Level absolute value signal, and outputs the selected signal to the VLC table, the second selection circuit receives the second selection signal outputted from the control circuit, selects the output signal of the second register, and outputs the selected signal to the VLC table, then the VLC table implements VLC, outputs an output signal to the first register, and in a fourth cycle, when the judgement of the LMAX VLC performed in the third cycle shows that the output signal is not correct, the control circuit judges whether the output signal of the first register is correct as RMAX VLC, and when the output signal of the first register is judged to be correct as RMAX VLC, outputs the third selection signal to the VLC generation circuit and the third selection circuit, the VLC generation circuit outputs the output signal of the first register as an RMAX VLC code, and the third selection circuit selects the output signal of the VLC generation circuit in accordance with the third selection signal and outputs the selected signal, and when it is judged that none of the output signals of the first register, inputted to the control circuit, is correct as VLC, in a fifth cycle, the third selection circuit selects the output signal of the FLC generation circuit and outputs the selected signal.

6. A variable length coding (VLC) apparatus comprising an RMAX table for receiving a Level absolute value signal as an absolute value of a Level signal and a Last signal; an LMAX table for receiving a Run signal and the Last signal; a first subtraction circuit for subtracting a sum of an output signal of the RMAX table and 1, from the Run signal; a second subtraction circuit for subtracting an output signal of the LMAX table from the Level absolute value signal; a second register for holding an output signal of the first subtraction circuit; a third register for holding an output signal of the second subtraction circuit; a first selection circuit for selecting one of an output signal of the third register and the Level absolute value signal; a second selection circuit for selecting one of an output signal of the second register and the Run signal; a VLC table for receiving an output signal of the first selection circuit, and output signal of the second selection circuit, a signal indicating the sign of the Level signal, and the Last signal; a first register for holding an output signal of the VLC table; a fixed length code (FLC) generation circuit for receiving the Level signal, the Run signal, and the Last signal; a control circuit for receiving an output signal of the first register; a VLC generation circuit for receiving the output signal of the first register and an output signal of the control circuit; and a third selection circuit for receiving an output signal of the VLC generation circuit and an output signal of the FLC generation circuit, wherein in a first cycle, the first selection circuit receives a first selection signal outputted from the control circuit, selects the Level absolute value signal, and outputs the selected signal to the VLC table, the second selection circuit receives a second selection signal outputted from the control circuit, selects the Run signal, and outputs the Run signal to the VLC table, then the VLC table implements VLC and outputs an output signal to the first register, and in a second cycle, the control circuit judges whether the output signal of the first register is correct as a normal VLC, and when the output signal of the first register is judged to be correct as a normal VLC, outputs a third selection signal indicating the judgement result to the VLC generation circuit and the third selection circuit, the VLC generation circuit outputs the output signal of the first register as a normal VLC code, and the third selection circuit selects the output signal of the VLC generation signal in accordance with the third selection signal and outputs the selected signal, and in the first cycle, the LMAX table receives the Last signal and the Run signal, generates an LMAX data signal, and outputs the generated signal to the second subtraction circuit, the second subtraction circuit receives the LMAX data signal and the Level absolute value signal, subtracts the LMAX data signal from the Level absolute value signal, and outputs an obtained result to the third register, and in the second cycle, the first selection circuit receives the first selection signal outputted from the control circuit, selects the output signal of the third register, and outputs the selected signal to the VLC table, the second selection circuit receives the second selection signal outputted from the control circuit, selects the Run signal, and outputs the Run signal to the VLC table, then the VLC table implements VLC and outputs an output signal to the first register, and in the third cycle, when the judgement of the normal VLC performed in the second cycle shows that the output signal is not correct, the control circuit judges whether the output signal of the first register is correct as LMAX VLC, and when the output signal of the first register is judged to be correct as LMAX VLC, outputs the third selection signal indicating the judgement result to the VLC generation circuit and the third selection circuit, the VLC generation circuit outputs the output signal of the first register as an LMAX VLC code, and the third selection circuit selects the output signal of the VLC generation circuit in accordance with the third selection signal and outputs the selected signal, and in the first cycle, the RMAX table receives the Last signal and the Level absolute value signal, generates an RMAX data signal, and outputs the generated signal to the first subtraction circuit, the first subtraction circuit receives the RMAX data signal and the Run signal, subtracts a value that is obtained by adding the RMAX data signal and 1, from the Run signal, and outputs an obtained result to the second register, and in the third cycle, the first selection circuit receives the first selection signal outputted from the control circuit, selects the Level absolute value signal, and outputs the selected signal to the VLC table, the second selection circuit receives the second selection signal outputted from the control circuit, selects an output signal of the second register, and outputs the selected signal to the VLC table, then the VLC table implements VLC and outputs an output signal to the first register, and in a fourth cycle, when the judgement of the LMAX VLC performed in the third cycle shows that the output signal is not correct, the control circuit judges whether the output signal of the first register is correct as PMAX VLC, and when the output signal of the first register is judged to be correct as RMAX VLC, outputs the third selection signal to the VLC generation circuit and the third selection circuit, the VLC generation circuit outputs the output signal of the first register as an RMAX VLC code, and the third selection circuit selects an output signal of the VLC generation circuit in accordance with the third selection signal and outputs the selected signal, and when it is judged that none of the output signals of the first register, inputted to the control circuit, is correct as VLC, in the fourth cycle, the third selection circuit selects the output signal of the FLC generation circuit and outputs the selected signal.

7. The variable length coding apparatus of claim 5 wherein the control circuit judges whether the output signal of the first register is correct or not as VLC, further decides the number of cycles in which the output signal is incorrect, thereby performing control of the VLC, and changes an output order of the VLC according to predetermined priorities.

8. A variable length coding (VLC) apparatus comprising a first selection circuit for receiving a Level absolute value signal as an absolute value of a Level signal, a Last signal, and fixed values, selecting one of the Level absolute value signal and the fixed value to output a first output signal, and selecting one of the Last signal and the fixed value to output a second output signal; an RMAX table for receiving the first output signal and the second output signal; a second selection circuit for receiving a Run signal, the Last signal and fixed values, selecting one of the Run signal and the fixed value to output a third output signal, and selecting one of the Last signal and the fixed value to output a fourth selection signal; an LMAX table for receiving the third output signal and the fourth output signal; a first subtraction circuit for subtracting a sum of an output signal of the RMAX table and 1, from the Run signal; a second subtraction circuit for subtracting an output signal of the LMAX table from the Level absolute value signal; a second register for holding an output signal of the first subtraction circuit; a third register for holding an output signal of the second subtraction circuit; a third selection circuit for selecting one of an output signal of the third register and the Level absolute value signal; a fourth selection circuit for selecting one of an output signal of the second register and the Run signal; a VLC table for receiving an output signal of the third selection circuit, an output signal of the fourth selection circuit, a signal indicating the sign of the Level signal, and the Last signal; a first register for holding an output signal of the VLC table; a fixed length code (FLC) generation circuit for receiving the Level signal, the Run signal, and the Last signal; a control circuit for receiving an output signal of the first register; a VLC generation circuit for receiving the output signal of the first register and an output signal of the control circuit; and a fifth selection circuit for receiving an output signal of the VLC generation circuit and an output signal of the FLC generation circuit, wherein in a first cycle, the first selection circuit receives a first selection signal outputted from the control circuit and selects the fixed value, the second selection circuit receives a second selection signal outputted from the control circuit and selects the Run signal and the Last signal, the third selection circuit receives a third selection signal outputted from the control circuit, selects the Level absolute value signal, and outputs the selected signal to the VLC table, the fourth selection circuit receives a fourth selection signal outputted from the control circuit, selects the Run signal, and outputs the Run signal to the VLC table, and then the VLC table implements VLC and outputs an output signal to the first register, and in a second cycle, the control circuit judges whether the output signal of the first register is correct as a normal VLC, and when the output signal of the first register is judged to be correct as a normal VLC, outputs a fifth selection signal indicating the judgement result to the VLC generation circuit and the fifth selection circuit, the VLC generation circuit outputs the output signal of the first register as a normal VLC code, and the fifth selection circuit selects the output signal of the VLC generation circuit in accordance with the fifth selection signal and outputs the selected signal, and in the first cycle, the LMAX table receives the Last signal and the Run signal, generates an LMAX data signal, and outputs the generated signal to the second subtraction circuit, the second subtraction circuit receives the LMAX data signal and the Level absolute value signal, subtracts the LMAX data signal from the Level absolute value signal, and outputs an obtained result to the third register, and in the second cycle, the third selection circuit receives the third selection signal outputted from the control circuit, selects the output signal of the third register, and outputs the selected signal to the VLC table, the fourth selection circuit receives the fourth selection signal outputted from the control circuit, selects the Run signal, and outputs the Run signal to the VLC table, then the VLC table implements VLC and outputs an output signal to the first register, and in a third cycle, when the judgement of the normal VLC performed in the second cycle shows that the output signal is not correct, the control circuit judges whether the output signal of the first register is correct as LMAX VLC, and when the output signal of the first register is judged to be correct as LMAX VLC, outputs the fifth selection signal indicating the judgement result to the VLC generation circuit and the fifth selection circuit, the VLC generation circuit outputs the output signal of the first register as an LMAX VLC code, and the fifth selection circuit selects an output signal of the VLC generation circuit in accordance with the fifth selection signal and outputs the selected signal, and in the second cycle, the RMAX table receives the Last signal and the Level absolute value signal, generates an RMAX data signal, and outputs the generated signal to the first subtraction circuit, and the first subtraction circuit receives the RMAX data signal and the Run signal, subtracts a value that is obtained by adding the RMAX data signal and 1, from the Run signal, and outputs an obtained result to the second register, and in the third cycle, the third selection circuit receives the third selection signal outputted from the control circuit, selects the Level absolute value signal, and outputs the selected signal to the VLC table, the fourth selection circuit receives the fourth selection signal outputted from the control circuit, selects the output signal of the second register, and outputs the selected signal to the VLC table, then the VLC table implements VLC and outputs an output signal to the first register, and in a fourth cycle, when the judgement of LMAX VLC performed in the third cycle shows that the output signal is not correct, the control circuit judges whether the output signal of the first register is correct as RMAX VLC, and when the output signal of the first register is judged to be correct as RMAX VLC, outputs the fifth selection signal indicating the judgement result to the VLC generation circuit and the third selection circuit, the VLC generation circuit outputs the output signal of the first register as an RMAX VLC code, and the fifth selection circuit selects an output signal of the VLC generation circuit in accordance with the fifth selection signal and outputs the selected signal, and when it is judged that none of the output signals of the first register, inputted to the control circuit, is correct as VLC, in the fourth cycle, the fifth selection circuit selects the output signal of the FLC generation circuit and outputs the selected signal.

9. The variable length coding apparatus of claim 8 wherein the control circuit judges whether the output signal of the first register is correct or not as VLC and further decides the number of cycles in which the output signal is incorrect, thereby performing control of the VLC, and changes an output order of the VLC according to predetermined priorities.

* * * * *